US011960094B2

(12) United States Patent
Nicholson et al.

(10) Patent No.: US 11,960,094 B2
(45) Date of Patent: *Apr. 16, 2024

(54) WEARABLE HEADS-UP DISPLAY WITH OPTICAL PATH FAULT DETECTION

(71) Applicant: GOOGLE LLC, Mountain View, CA (US)

(72) Inventors: Stuart James Myron Nicholson, Waterloo (CA); Timothy Paul Bodiya, Toronto (CA)

(73) Assignee: GOOGLE LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/150,982

(22) Filed: Jan. 6, 2023

(65) Prior Publication Data
US 2023/0152593 A1    May 18, 2023

Related U.S. Application Data

(63) Continuation of application No. 17/067,229, filed on Oct. 9, 2020, now Pat. No. 11,561,400.

(60) Provisional application No. 62/913,825, filed on Oct. 11, 2019.

(51) Int. Cl.
| | |
|---|---|
| *G02B 27/01* | (2006.01) |
| *F21V 8/00* | (2006.01) |
| *G02B 6/00* | (2006.01) |
| *G02C 11/00* | (2006.01) |
| *G02B 26/08* | (2006.01) |
| *G02B 26/10* | (2006.01) |
| *G02C 5/22* | (2006.01) |
| *H01S 5/00* | (2006.01) |

(52) U.S. Cl.
CPC ....... *G02B 27/0172* (2013.01); *G02B 6/0023* (2013.01); *G02B 6/005* (2013.01); *G02C 11/10* (2013.01); *G02B 26/0816* (2013.01); *G02B 26/10* (2013.01); *G02B 2027/0123* (2013.01); *G02B 2027/014* (2013.01); *G02B 2027/0178* (2013.01); *G02C 5/22* (2013.01); *H01S 5/0014* (2013.01)

(58) Field of Classification Search
CPC .. G02B 27/0172; G02B 6/0023; G02B 6/005; G02B 6/00; G02B 2027/0178; G02C 11/10
See application file for complete search history.

(56) References Cited

U.S. PATENT DOCUMENTS

| | | | |
|---|---|---|---|
| 10,663,732 B2 * | 5/2020 | Holland | ............... G02B 27/141 |
| 2019/0033585 A1 * | 1/2019 | Xu | ..................... G02B 27/1006 |
| 2021/0157140 A1 * | 5/2021 | Potnis | .................. G02B 27/017 |

* cited by examiner

*Primary Examiner* — Xuemei Zheng

(57) ABSTRACT

A wearable heads-up display includes a power source, laser sources, and a lightguide. A photodetector is positioned to detect an intensity of a test light emitted at a perimeter of the lightguide from an optical path within the lightguide. A laser safety circuit provides a control to reduce or shut off a supply of electrical power from the power source to the laser sources in response to an output signal from the photodetector indicating that the detected intensity is below a threshold.

20 Claims, 17 Drawing Sheets

WEARABLE HEADS-UP DISPLAY WITH OPTICAL PATH FAULT DETECTION

CROSS-REFERENCE TO RELATED APPLICATIONS

The present application is a continuation application of U.S. patent application Ser. No. 17/067,229, entitled "WEARABLE HEADS-UP DISPLAY WITH OPTICAL PATH FAULT DETECTION" and filed on Oct. 9, 2020, which claims priority to U.S. Provisional Application No. 62/913,825, entitled "WEARABLE HEADS-UP DISPLAY WITH OPTICAL PATH FAULT DETECTION" and filed on Oct. 11, 2019, the entirety of which are incorporated by reference herein.

TECHNICAL FIELD

This disclosure relates to wearable heads-up displays (WHUDs) that use laser light to form a display and to minimization of risk of laser accidents while using the WHUD.

BACKGROUND

WHUDs are wearable electronic devices that use optical combiners to combine real world and virtual images. The combiner may be integrated with one or more lenses to provide a display lens that is fitted into a support frame of a WHUD. The display lens would provide an eyebox that is viewable by a user when the WHUD is worn on the head of the user. One class of combiners uses a lightguide (or waveguide) to transfer light. In general, light from a projector of the WHUD enters the lightguide of the combiner through an in-coupler, propagates along the lightguide by total internal reflection (TIR), and exits the lightguide through an out-coupler. If the pupil of the eye is aligned with one or more exit pupils provided by the out-coupler, at least a portion of the light exiting through the out-coupler will enter the pupil of the eye, thereby enabling the user to see a virtual image in a display space associated with the WHUD. If the combiner is transparent or semitransparent, the user will also be able to see the real world.

Some WHUDS use laser projectors to project the light that is used to form a display. Since WHUDS are worn near the eyes of the user, use of laser light to form a display raises safety concerns. In general, lasers are classified based on their potential to cause injury to human eyes and skin. There are four main classes for visible beam lasers, with Class 1 lasers being the safest and Class 4 lasers being the least safe. Class 1 lasers are safe under all conditions of use—the lasers are safe either because of a low power output or due to an enclosure that prevents user access to the laser beam during normal operation. Class 2 lasers are relatively safe to the extent that the user does not stare at the beam without blinking for an extended period of time. Class 3 lasers are generally considered to be dangerous to the eye, especially when used in combination with optical devices that change the beam diameter and/or power density. Class 4 lasers put out high optical powers that are considered to be dangerous with or without optical devices that change beam diameter and/or power density. The safest WHUD will be one whose maximum accessible exposure is managed such that the device is effectively a Class 1 laser product.

When a lightguide-based combiner is used in a WHUD, there is a risk that the lightguide may fracture, e.g., if the user accidentally drops the WHUD on a hard surface such that the lightguide is subjected to loads that exceed the fracture strength of the lightguide. If a fractured lightguide is used to transfer laser light, uncontrolled laser light leakage is likely to occur at the fracture(s) in the lightguide. If the pupil of the eye happens to be aligned with the fracture(s), the leaking laser light may enter the pupil of the eye and impinge on the retina. In some cases, a much higher laser power than would ultimately be delivered to the eye may be coupled into the lightguide. As an example, the much higher laser power may have been selected to accommodate inefficiencies in the system such that when the laser light is coupled out of the lightguide by the out-coupler, the appropriate level of laser power will be delivered to the eye to achieve a display with the appropriate brightness within laser safety limits. In cases where laser light with a relatively high level of laser power is coupled into a fractured lightguide, there is a risk of exposing the eye to unsafe laser power levels. Safety concerns may be not only to the WHUD user but also to an observer that happens to be standing in front of the WHUD user and in the field of view of the combiner.

Being able to make a WHUD that looks like normal eyeglasses has been one of the most interesting and complex problems in the art. The support frame of such a WHUD would have a frame front and temples that are attached to the frame front by hinges. The hinges would allow the temples to be foldable in the same manner as normal eyeglasses. The laser projector of the WHUD could be hidden within the temple, and the frame front could carry the display lens. This means that there needs to be a way of getting the laser light from the laser projector to the combiner that is carried by the display lens while maintaining the normal eyeglasses appearance. One approach has been to transmit the laser light from the temple through an opening at the front end of the temple and an opening at the back end of the frame front to the combiner. In this case, if the temple is folded, the front opening of the temple through which the laser light exits will be exposed to the environment. If for some reason the laser projector is outputting laser light while the temple is folded, laser light that was meant to be delivered to the combiner would not reach the combiner and would instead spill into the environment, possibly creating a laser hazard.

SUMMARY

An improved WHUD may be summarized as including a power source, a plurality of laser sources, a lightguide having at least one optical path defined therein, at least one photodetector, and a laser safety circuit. The at least one photodetector is positioned to detect an intensity of a portion of a test light that reaches a surface portion of the lightguide from the at least one optical path. The laser safety circuit is communicatively coupled to the power source and the at least one photodetector. The laser safety circuit provides a control to reduce or shut off a supply of electrical power from the power source to the plurality of laser sources in response to an output signal from the at least one photodetector indicating that the detected intensity is below a threshold.

Another improved WHUD may be summarized as including a first laser source, a second laser source, a power source, a lightguide having a first optical path and a second optical path defined therein, a first in-coupler positioned to receive a first laser light outputted by the first laser source and couple the first laser light into the first optical path, a second in-coupler positioned to receive a second laser light outputted by the second laser source and couple the second laser light into the second optical path, a photodetector, and a laser safety circuit. The photodetector detects an intensity of a portion of the first laser light that reaches a surface portion of the lightguide from the first optical path. The laser safety circuit is communicatively coupled to the power source and the photodetector. The laser safety circuit provides a control to reduce or shut off a supply of electrical power from the power source to the second laser source in response to an output signal from the photodetector indicating that the detected intensity is below a threshold.

Another improved WHUD may be summarized as including a first laser source; a second laser source; a power source; a lightguide having a first optical path, a second optical path, and a third optical path defined therein; a first in-coupler positioned to receive a first laser light outputted by the first laser source and couple the first laser light into the first optical path and the second optical path; a second in-coupler positioned to receive a second laser light outputted by the second laser source and couple the second laser light into the third optical path; a first photodetector; a second photodetector; and a laser safety circuit. The first photodetector detects a first intensity of a portion of the first laser light that reaches a first portion of a surface of the lightguide from the first optical path. The second photodetector detects a second intensity of a portion of the second laser light that reaches a second portion of the surface of the lightguide from the second optical path. The laser safety circuit is communicatively coupled to the first photodetector, the second photodetector, and the power source. The laser safety circuit provides a control to reduce or shut off a supply of electrical power from the power source to the second laser source in response to an output signal from the first photodetector indicating that the detected first intensity is below a first threshold and/or an output signal from the second photodetector indicating that the detected second intensity is below a second threshold.

Another improved WHUD may be summarized as including a power source, a laser module including at least one laser source, a lightguide having at least one optical path defined therein, an in-coupler positioned to receive a display light outputted by the laser module and couple the display light into the at least one optical path, at least one light source to output a test light that is directed into the lightguide through a first portion of a surface of the lightguide, a photodetector, and a laser safety circuit. The photodetector is positioned to detect an intensity of a portion of the test light that reaches a second portion of the surface of the lightguide from within the lightguide. The laser safety circuit is communicatively coupled to the power source and the photodetector. The laser safety circuit provides a control to reduce or shut off a supply of electrical power from the power source to the laser module in response to an output signal from the photodetector indicating that the detected intensity is below a threshold.

A method of safely operating a WHUD having a field a view, a lightguide positioned within the field of view, a plurality of laser sources, a power source, and a support frame may be summarized as including testing the WHUD for optical path faults at select times during use of the WHUD. The testing may include generating a test light, directing the test light along a projection optical path, and detecting an intensity of a portion of the test light that reaches a portion of a surface of the lightguide from an optical path within the lightguide. In response to detecting an intensity of the portion of the test light that is below a threshold, reducing or shutting off a supply of electrical power from the power source to the plurality of laser sources.

The foregoing general description and the following detailed description are exemplary of the invention and are intended to provide an overview or framework for understanding the nature of the invention as it is claimed. The accompanying drawings are included to provide further understanding of the invention and are incorporated in and constitute part of this specification. The drawings illustrate various embodiments of the invention and together with the description serve to explain the principles and operation of the invention.

BRIEF DESCRIPTION OF DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements and have been solely selected for ease of recognition in the drawing.

DETAILED DESCRIPTION

Figure 1:
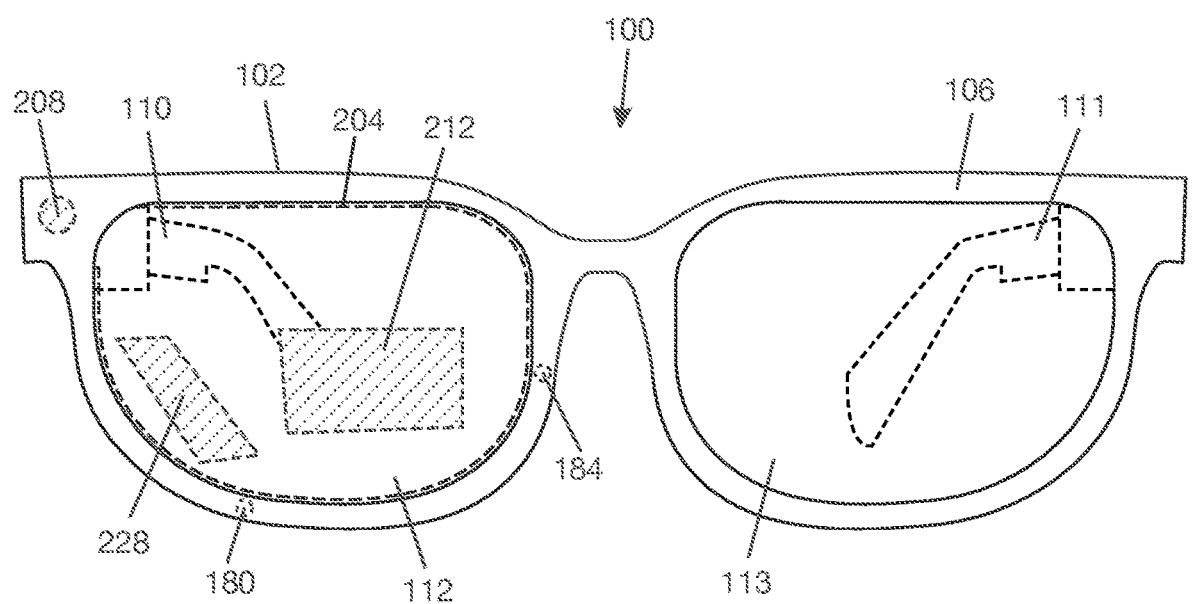
FIG. 1 is a front elevational view of a WHUD.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with portable electronic devices and head-worn devices have not been shown or described in detail to avoid unnecessarily obscuring descriptions of the embodiments. For the sake of continuity, and in the interest of conciseness, same or similar reference characters may be used for same or similar objects in multiple figures. For the sake of brevity, the term "corresponding to" may be used to describe correspondence between features of different figures. When a feature in a first figure is described as corresponding to a feature in a second figure, the feature in the first figure is deemed to have the characteristics of the feature in the second figure, and vice versa, unless stated otherwise.

In this disclosure, unless the context requires otherwise, throughout the specification and claims which follow, the word "comprise" and variations thereof, such as, "comprises" and "comprising" are to be construed in an open, inclusive sense, that is as "including, but not limited to."

In this disclosure, reference to "one implementation" or "an implementation" or to "one embodiment" or "an embodiment" means that a particular feature, structures, or characteristics may be combined in any suitable manner in one or more implementations or one or more embodiments.

In this disclosure, the singular forms "a," "an," and "the" include plural referents unless the content clearly dictates otherwise. It should also be noted that the term "or" is generally employed in its broadest sense, that is, as meaning "and/or" unless the content clearly dictates otherwise.

The headings and Abstract of the disclosure provided herein are for convenience only and do not interpret the scope or meaning of the embodiments.

FIG. 1 shows a WHUD 100 according to one illustrative implementation. WHUD 100 may be a retinal display that projects light carrying an image to an eye of a user. The user will have a perception of seeing an image on a display screen floating in space some distance in front of the eye. However, in reality the image is on the retina of the eye and not on a display screen. WHUD 100 includes a support frame 102 that can be worn on the head of the user. Support frame 102 carries the devices, electronics, and software that enable WHUD 100 to display content. In one example, support frame 102 includes a frame front 106 and temples (or arms) 110, 111 attached to opposite sides of frame front 106. Many of the components of WHUD 100, such as the components that form a laser projector, are carried by or within temples 110, 111. Other components, such as lenses 112, 113, are carried by frame front 106. In the example shown in FIG. 1, lens 112 is a display lens in that it has an integrated display combiner. In general, either of lenses 112, 113 may be a display lens, or both lenses 112, 113 may be display lenses to enable a binocular display.

Figure 2:
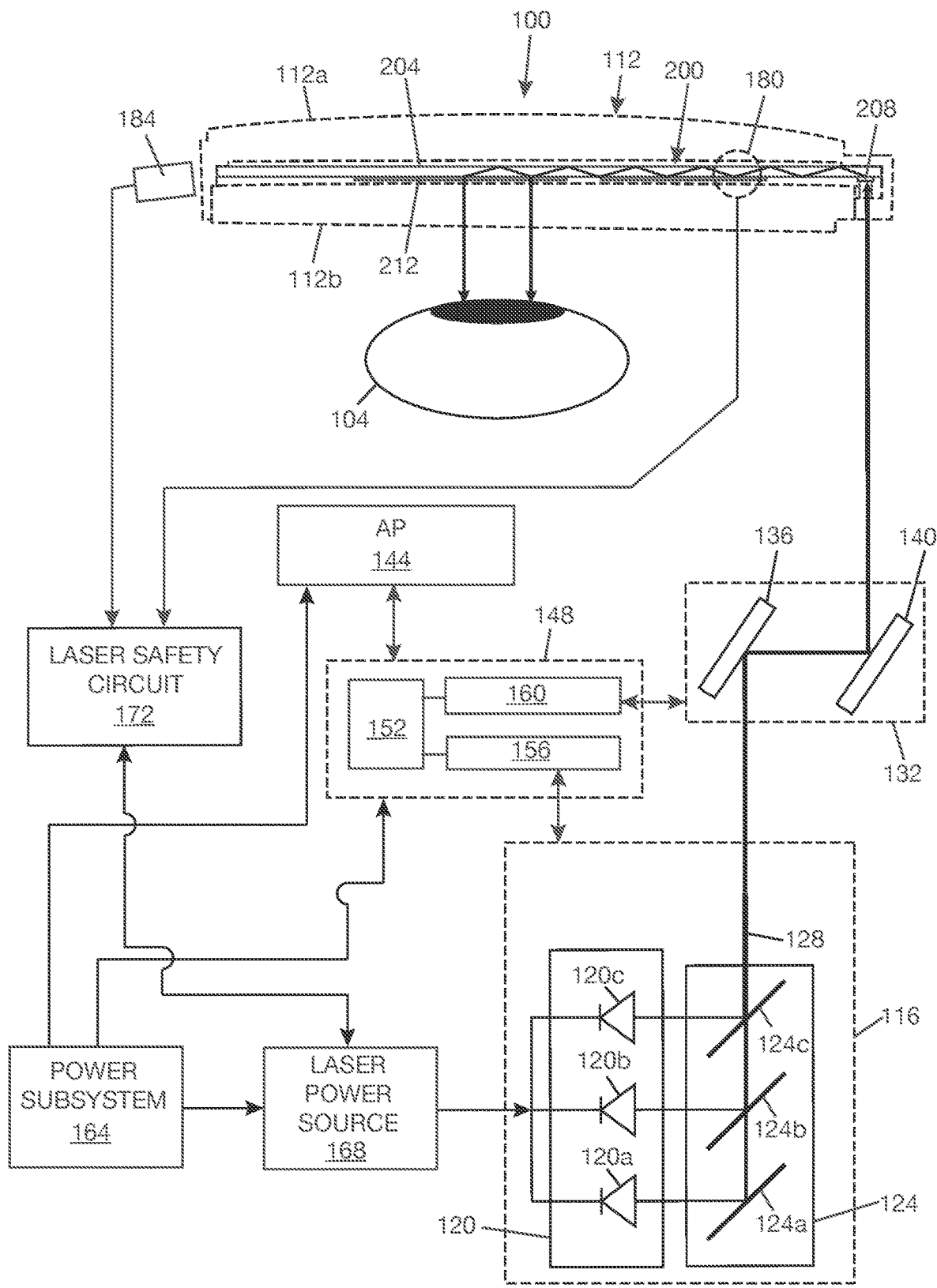
FIG. 2 is a schematic diagram of a portion of a WHUD positioned relative to an eye.

FIG. 2 is a schematic diagram showing a portion of WHUD 100 positioned relative to an eye 104 according to one illustrative implementation. In FIG. 2, a display combiner 200 is integrated with lens 112. In one example, lens 112 has two lens parts 112a, 112b, and display combiner 200 is stacked with lens parts 112a, 112b. Each of lens parts 112a, 112b is itself a lens, e.g., lens part 112a may be a planoconvex lens or a meniscus lens, and lens part 112b may be a planoconcave lens, a meniscus lens, or a biconcave lens. Display combiner 200 includes a lightguide 204, an in-coupler 208 to couple light into lightguide 204, and an out-coupler 212 to couple light out of lightguide 204. In one example, lightguide 204 may be an optical substrate having a higher refractive index compared to a surrounding medium (e.g., air). In another example, lightguide 204 may be a dielectric waveguide including a core layer between two cladding layers, where the core layer has a higher refractive index compared to the cladding layers. Light that enters lightguide 204 at an angle equal to or greater than an associated critical angle will propagate within lightguide 204 by TIR. When eye 104 is aligned with out-coupler 212, eye 104 can receive at least a portion of the light coupled out of lightguide 204 by out-coupler 212.

In one implementation, WHUD 100 includes a light engine 116 that outputs laser light. Light engine 116 includes a laser module 120, which includes a number of laser sources to generate laser light. For illustrative purposes, laser module 120 is shown as including three laser sources 120a, 120b, 120c. In one example, laser sources 120a, 120b, 120c are visible laser sources—visible laser light generated by these laser sources may be used to form a display image that is seen by eye 104. As an example, laser source 120a may be a red laser diode that outputs red light in the visible range, laser source 120b may be a green laser diode that outputs green light in the visible range, and laser source 120c may be a blue laser diode that outputs blue light in the visible range. The adjectives used before the term "laser diode" refer to a characteristic of the output of the laser diode, e.g., the wavelength(s) or band of wavelengths of light outputted by the laser diode. Also, other types of laser sources besides laser diodes may be used as the visible laser sources. Also, laser sources other than visible laser sources may be included in laser module 120. Light engine 116 may include a beam combiner 124 with optical elements 124a, 124b, 124c, such as dichroic filters, arranged to combine light from laser sources 120a, 120b, 120c into an aggregated beam 128.

In one implementation, WHUD 100 includes a display modulator 132 that receives laser light from light engine 116 and modulates the laser light to form a virtual image that is seen by eye 104. In one example, display modulator 132 includes scan mirrors 136, 140, each of which is a mono-axis mirror that oscillates or rotates about its respective axis. Alternatively, display modulator 132 may include a 2D scan mirror that is rotatable about two different axes instead of two mono-axis mirrors. The scan mirror(s) may be micro-electromechanical systems (MEMS) mirror(s), piezoelectric mirror(s), or the like. The scan mirror(s) may be controlled to form a predetermined display pattern, such as a raster pattern or a Lissajous pattern. In the illustrated example, for each scan orientation (i.e., relative positions of the scan mirrors 136, 140), scan mirror 136 receives beam 128 from beam combiner 124 and reflects beam 128 to scan mirror 140, which redirects beam 128 towards in-coupler 208. Although not shown in FIG. 2, there may be an arrangement of relay optics between display modulator 132 and in-coupler 208 to guide beam 128 from display modulator 132 to in-coupler 208.

In general, light engine 116 and display modulator 132 with scan mirror(s) constitute a scanning laser projector. In alternative implementations, WHUD 100 may use other types of display light sources besides a scanning laser projector, such as organic light-emitting diode (OLED) micro-display, liquid crystal on silicon (LCOS) micro-display, and digital light processing (DLP) display.

WHUD 100 includes an application processor (AP) 144. In one example, AP 144 is a microprocessor that runs the operating system and applications software of the WHUD. AP 144 may include, for example, a processor, graphics processing unit (GPU), and memory (not shown separately). WHUD 100 includes a display engine 148 that is communicatively coupled to AP 144. In one example, display engine 148 includes a display controller 152, a laser diode driver (or laser source driver in general) 156, and a scan mirror driver 160. In one example, display controller 152 receives image data from AP 144 and processes the image data for display. For example, the display controller 152 may pre-warp and apply various corrections to the image data to enhance the quality of the eventual display. Display controller 152 provides laser controls to laser diode driver 156 and sync controls to scan mirror driver 160 based on the image data. Laser diode driver 156 modulates the outputs of the laser sources in laser module 120 according to the laser controls that it receives from display controller 152. For example, an image to be displayed typically has pixels, each of which is made of a combination of red, green, and blue colors. Laser diode driver 156 would control the laser sources in laser module 120 to generate a combination of red, green, and blue light that represents each pixel in the image. Scan mirror driver 160 applies driving voltages to the scan mirror(s) of display modulator 132 so that beam 128 outputted by light engine 116 lands on the correct spot in the display space associated with the WHUD.

Light that is outputted from light engine 116 travels to display modulator 132 and then to in-coupler 208 along a "support frame optical path", enters lightguide 208, propagates along one or more optical paths within lightguide 204 by TIR, and comes out of lightguide 204 at out-coupler 212. "Support frame optical path" is an optical path that is defined within the support frame (102 in FIG. 1) of the WHUD. In an implementation of the WHUD where light engine 116 and display modulator 132 are carried within temple 110 (in FIG. 1), support frame optical path would extend along temple 110, through an opening in frame front 106 (in FIG. 1), to display combiner 200 carried by lens 112. The support frame optical path and lightguide optical path(s) make up the optical path network of the WHUD. Any faults in the optical path network of the WHUD may be a potential source of laser light leakage from the WHUD. For laser safety reasons, it is generally desirable to detect faults in the optical path network as soon as possible so that steps can be taken to minimize the risk of a laser accident.

WHUD 100 includes a power subsystem 164 that supplies electrical power to laser power source 168, display engine 148, AP 144, and other components of the WHUD not specifically mentioned. Power subsystem 146 may include a power manager and an energy storage, and energy may be stored in the energy storage via charging of the WHUD from an external source. Laser power source 168 provides electrical power to laser sources in laser module 120 according to the laser controls provided by laser diode driver 156. WHUD 100 includes a laser safety circuit 172, which is in communication with laser power source 168 and display engine 148. Accordingly, if there is a fault in the optical path network of the WHUD, laser safety circuit 172 can take actions to minimize the risk of a laser accident.

In one implementation, faults in the optical path network of the WHUD are detected by monitoring light emitted at a perimeter of lightguide 204 from known optical path(s) within lightguide 204. In one implementation, WHUD 100 includes one or more photodetectors positioned to detect light emitted at selected positions on the perimeter of lightguide 204—these selected positions are aligned with known optical paths within lightguide 204. For illustration purposes, two photodetectors 180, 184 are shown in FIG. 2. However, the number of photodetectors will generally depend on the number of optical paths within the lightguide that are to be monitored. In one implementation, laser safety circuit 172 receives the outputs of photodetectors 180, 184. Under certain conditions, the output(s) of the photodetector(s) may cause laser safety circuit 172 to trigger an optical path fault (OPF) event.

In one implementation, upon triggering an OPF event, laser safety circuit 172 may send a laser power shutoff control to laser power source 168, which would prompt laser power source 168 to stop supplying electrical power to laser module 120, which would stop light engine 116 from outputting laser light. Laser safety circuit 172 may also send a notification of the OPF event to display engine 148, which may prompt display engine 148 to stop providing display controls to laser diode driver 156 and scan mirror driver 160.

An alternative to shutting off the light engine 116 in response to an OPF event may be to allow the light engine 116 to have a low power mode and a normal power mode. When an OPF event is triggered and the triggering condition has not been resolved, the light engine 116 may operate in the low power mode. When the WHUD does not have an active OPF event, light engine 116 may operate in a normal power mode. In one implementation, in the low power mode, laser light that is outputted by light engine 116 will have an optical power density that does not exceed the maximum permissible exposure for a Class 1 laser—this would generally result in a dim display given the inefficiencies of the display combiner. In the low power mode, any laser light that may escape from faults in the optical path network should generally be safe for the eye. In the normal power mode, laser light that is outputted by light engine 116 may be outside of Class 1 laser safety limits, with the expectation that the laser light that will be ultimately delivered to the eye will generally be within the Class 1 laser safety limits. In this case, when an OPF event is triggered, laser safety circuit 172 may send a control to laser power source 168 to change the power mode of light engine 116 to low power mode, which would limit the power provided to the laser sources in laser module 120 to comply with the requirements of the low power mode. Laser safety control 172 may also notify display engine 148 of the OPF event. Display engine 148 may use such information to limit the amount of processing applied to image data before generating controls for laser source driver 156 and scan mirror driver 160. For example, if the display will be dim, certain processing to improve the quality of the display may be omitted.

Figure 3:
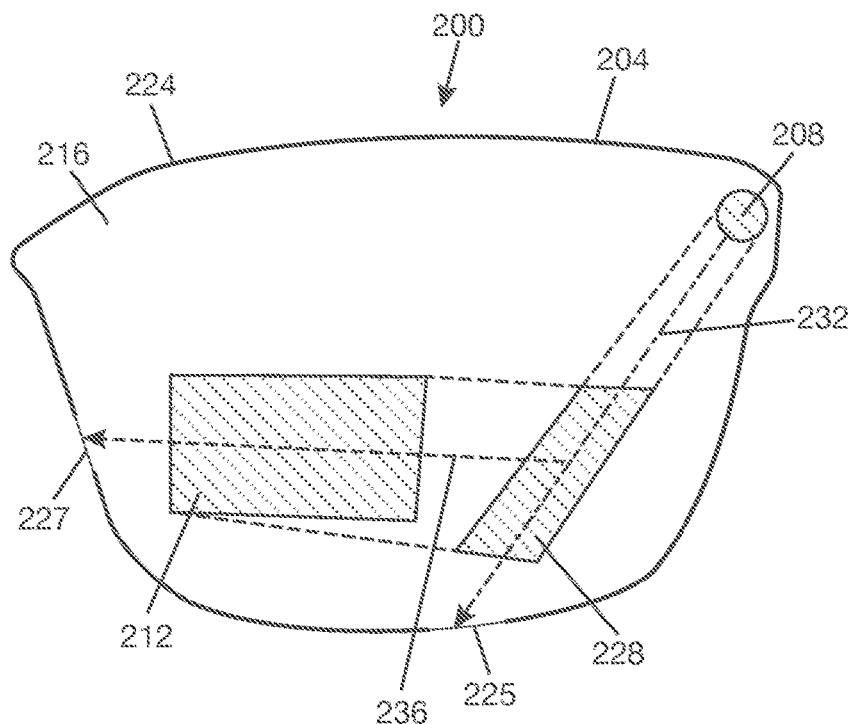
FIG. 3 is a plan view of a display combiner.
Figure 4:
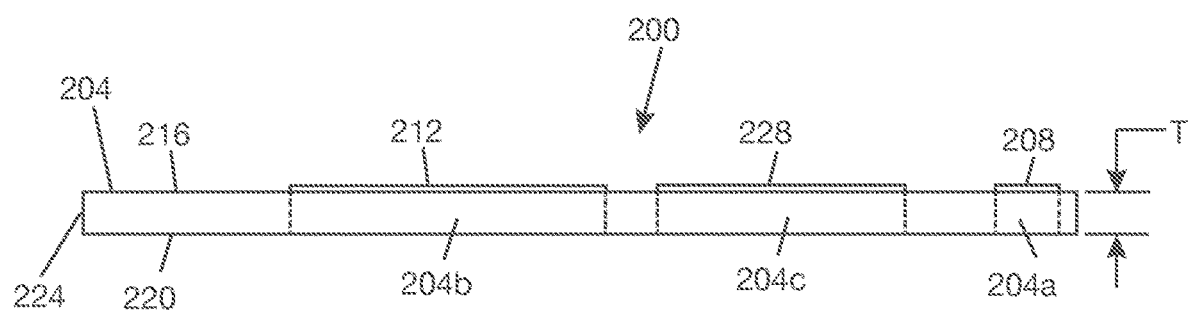
FIG. 4 is a side view of the display combiner shown in FIG. 3.

FIGS. 3 and 4 show display combiner 200 with lightguide 204, in-coupler 208, and out-coupler 212 according to one illustrative implementation. Lightguide 204 has major surfaces 216, 220 (in FIG. 4) and a perimeter surface 224. Major surfaces 216, 220 may be referred to as front and back surfaces, respectively, for convenience. Front and back surfaces 216, 220 are opposed surfaces that are separated by an axial thickness T (in FIG. 4) of lightguide 204—axial thickness T may be constant or may vary across the lightguide. Perimeter surface 224 wraps around a perimeter of lightguide 204 and may include portions of front and back surfaces 216, 220 proximate the perimeter of lightguide 204. A light absorbing material or structure may be selectively disposed on perimeter surface 224 to manage stray light from the perimeter of lightguide 204. In general, portion(s) of perimeter surface 224 where light emission is to be detected for the purpose of OPF detection would not have the light absorbing material or structure. Lightguide 204 may be planar, i.e., front and back surfaces 216, 220 are planar surfaces. Alternatively, lightguide 204 may be non-planar, e.g., one or both of front and back surfaces 216, 220 are non-planar. For example, one or both of front and back surfaces 216, 220 may be curved surfaces (i.e., a surface that does not lie flat in a plane) or complex surfaces (e.g., a surface having flat portion(s) and curved portion(s)).

Lightguide 204 has an input region 204a (in FIG. 4) to receive an input light. In-coupler 208 is positioned at input region 204a to couple the input light into input region 204a. The input light is directed or steered to strike in-coupler 208 at an appropriate incident angle to encourage propagation of the light by TIR once coupled into lightguide 204. In one example, in-coupler 208 may be an optical grating, which may be designed, for example, with surface relief grating(s), volume hologram grating(s), or metasurface(s). In-coupler 208 may be a transmission grating or a reflection grating. A transmission grating transmits light and applies desired optical function(s) to the light during transmission, whereas a reflection grating reflects light and applies desired optical function(s) to the light during reflection. In-coupler 208 may be physically coupled (e.g., adhered, embedded, or otherwise attached) to lightguide 204 at input region 204a. In-coupler 208 may be positioned at or proximate a portion of front surface 216 at input region 204a (as shown in FIGS. 3 and 4) or may be positioned at or proximate a portion of back surface 220 at input region 204a (not illustrated), depending on whether in-coupler 208 is a transmission grating or a reflection grating and the incoming direction of the input light from the source. In some cases, in-coupler 208 may be a prism.

At least a portion of the input light coupled into input region 204a by in-coupler 208 may propagate to an output region 204b (in FIG. 4) of lightguide 204. The light may propagate by TIR along one or more optical paths defined within lightguide 204. Out-coupler 212 is positioned at output region 204b to couple light out of output region 204b and direct the output light to a target, e.g., eye 104 in FIG. 2. In one example, out-coupler 212 may be an optical grating, which may be designed, for example, with surface relief grating(s), volume hologram grating(s), or metasurface(s). Out-coupler 212 may be a transmission grating or a reflection grating. Out-coupler 212 may be physically coupled (e.g., adhered, embedded, or otherwise attached) to lightguide 204 at output region 204b. Out-coupler 212 may be positioned at or proximate a portion of front surface 216 at output region 204b (in FIGS. 3 and 4) or may be positioned at or proximate a portion of back surface 220 at output region 204b (not illustrated), depending on whether out-coupler 212 is a transmission grating or a reflection grating and the outgoing direction of the output light to the target.

Figure 5:
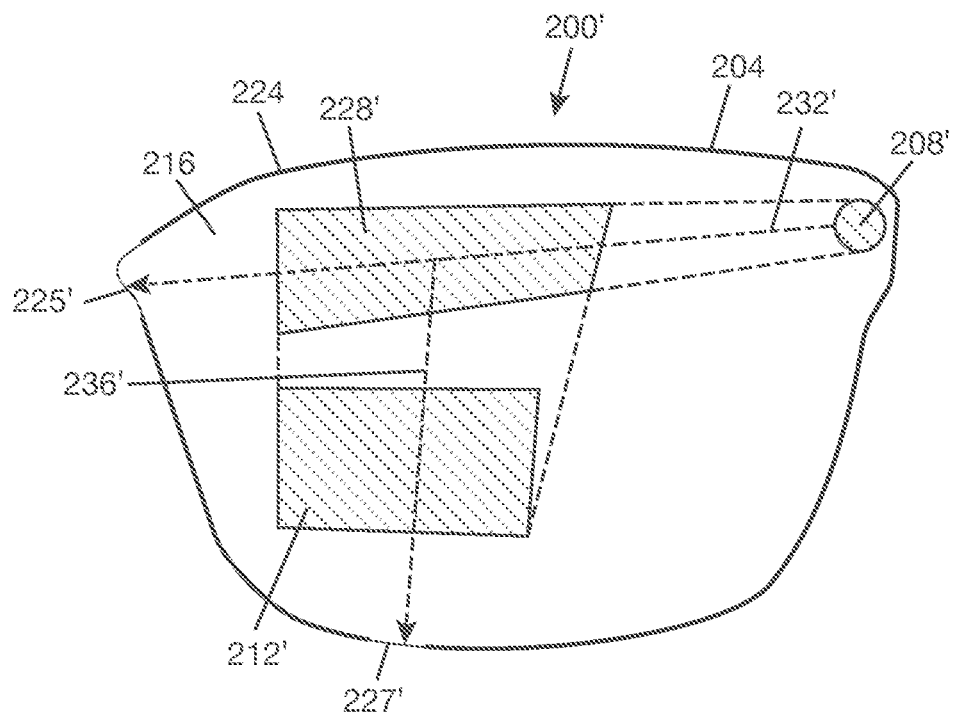
FIG. 5 is a plan view of a display combiner showing alternative positioning of an exit pupil expander (EPE) on a lightguide.

Display combiner 200 may include light redirecting elements between in-coupler 208 and out-coupler 212. For example, display combiner 200 may include an exit pupil expander (EPE) 228 between in-coupler 208 and out-coupler 212. EPE 228 is an optical structure that provides beam expansion and changes in beam propagation direction. EPE 228 is positioned to receive light that is propagating from input region 204a, expand the light, and redirect the light towards output region 204b. A region 204c (in FIG. 4) of lightguide 204 that is in registration with EPE 228 may be referred to as a fold region in that it is neither an input region nor an output region. EPE 228 may be a fold grating, which may be designed, for example, with surface relief grating(s) or volume hologram grating(s) or metasurface(s). In FIG. 3, EPE 228 is located to the right of out-coupler 212 and below in-coupler 208, which means that light will go down from input region 204a (in FIG. 4) and then turn left towards out-coupler 212. FIG. 5 shows optical combiner 200' with an alternative location for EPE 228' that is above out-coupler 212' and to the left of in-coupler 208', where light will go to the left from input region 204a (in FIG. 3) and then turn down towards out-coupler 212'. Where to locate an EPE on lightguide 204 is a design choice and may be constrained by the geometry of lightguide 204, which may be constrained by the geometry of the lens into which display combiner 200 is integrated.

Referring to FIGS. 3, 4, and 5, EPE 228 (228') enables optical combiner 200 (200') to support a larger field of view (FOV) than would be possible without an EPE and for the same lightguide geometry. In general, in-coupler 208 receives an input light from a source, e.g., display modulator 132 in FIG. 2, couples the input light into input region 204a and directs the input light to a primary optical path 232 (232') within lightguide 204. Primary optical path 232 passes through fold region 204c. EPE 228 (228') is positioned along (or aligned with) primary optical path 232 (232') such that the light propagating along primary optical path 232 (232') bounces along EPE 228 (228'). EPE 228 (228') will expand at least a portion of the light that it receives from primary optical path 232 (232') and redirect the expanded light to a branch optical path 236 (236') within lightguide 204. Branch optical path 236 (236') passes through output region 204b. Out-coupler 212 is positioned at output region 204b such that the light propagating along branch optical path 236 (236') bounces along out-coupler 212. Out-coupler 212 will couple light that it receives from branch optical path 236 (236') out of the lightguide.

Figure 6:
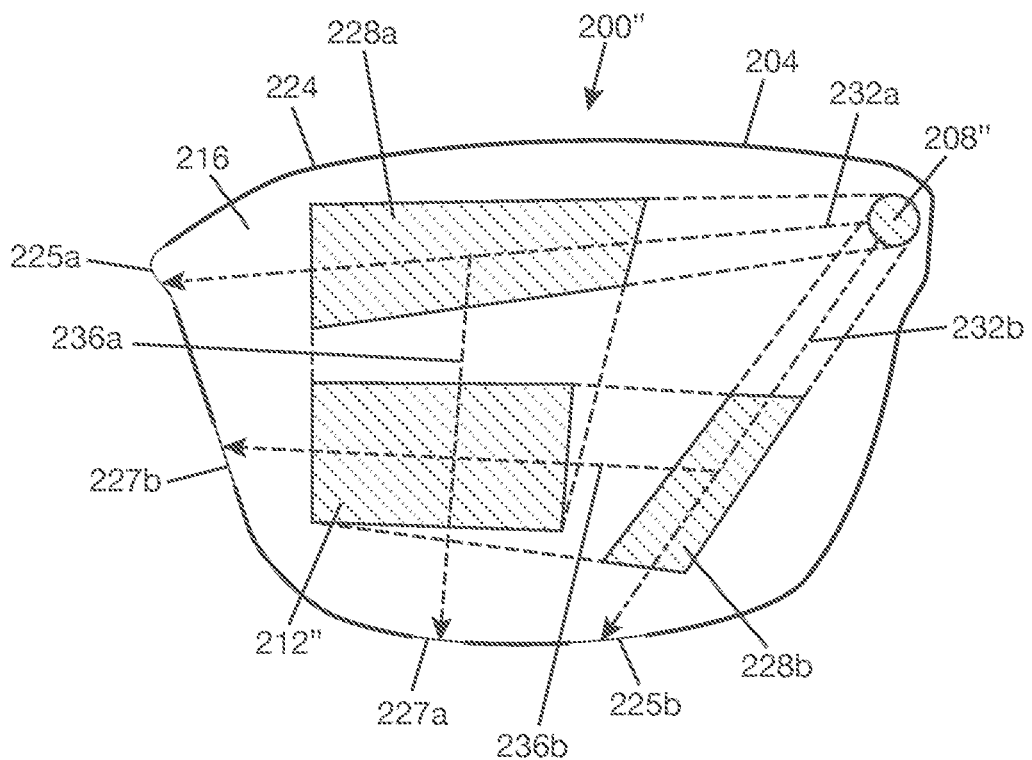
FIG. 6 is a plan view of a display combiner with two EPEs.

Two EPEs may be used to support a larger FOV than possible with a single EPE. FIG. 6 shows optical combiner 200" with EPEs 228a, 228b positioned at intermediate stages between in-coupler 208" and out-coupler 212". EPEs 228a, 228b can have the same characteristics described above for EPE 228 (in FIG. 3). In this alternative implementation, in-coupler 208" directs a first portion of an input light into a first primary optical path 232a within lightguide 204 and a second portion of the input light into a second primary optical path 232b within lightguide 204. EPE 228a is positioned along first primary optical path 232a to receive light from first primary optical path 232a, expand at least a portion of the light, and redirect the expanded light to a first branch optical path 236a within lightguide 204. EPE 228b is positioned along second primary optical path 232b to receive light from second primary optical path 232b, expand at least a portion of the light, and redirect the expanded light to a second branch optical path 236b within lightguide 204. Out-coupler 212" is positioned to receive light from both first branch optical path 236a and second branch optical path 236*b* and to couple at least a portion of the received light out of lightguide 204. In-coupler 208" and out-coupler 212" may be optical gratings, which may be designed with, for example, surface relief grating(s), volume hologram grating(s), or metasurface(s). Examples of suitable optical gratings for use with dual EPEs are described, for example, in U.S. Provisional Application No. 62/846,979 ("Single RGB Combiner with Large Field of View").

Returning to FIG. 3, some of the light traveling along primary optical path 232 will be redirected to branch optical path 236 by EPE 228. The remaining portion of the light that is not redirected to branch optical path 236 by EPE 228 will continue to travel along primary optical path 232 until reaching a portion 225 of perimeter surface 224 that is aligned with primary optical path 232. Also, some of the light redirected to branch optical path 236 will be coupled out of lightguide 204 by out-coupler 212. The remaining portion of the light that is not coupled out by out-coupler 212 will continue to travel along branch optical path 236 until reaching a portion 227 of perimeter surface 224 that is aligned with branch optical path 236. Thus, for every input light that in-coupler 208 receives and couples into lightguide 204 at an angle that encourages TIR, some of the input light will reach perimeter surface portion 225 from primary optical path 232 and some of the input light will reach perimeter surface portion 227 from the branch optical path 236, provided that there are no breaks in optical paths 232, 236. If there are breaks in optical paths 232, 236, light may not reach perimeter surface portions 225, 227, or the amount of light that reaches perimeter surface portions 225, 227 may be diminished compared to when there are no breaks in the optical paths. Breaks in optical paths 232, 236 may occur if fractures develop in lightguide 204 and the fractures cross optical paths 232, 236.

Figure 7:
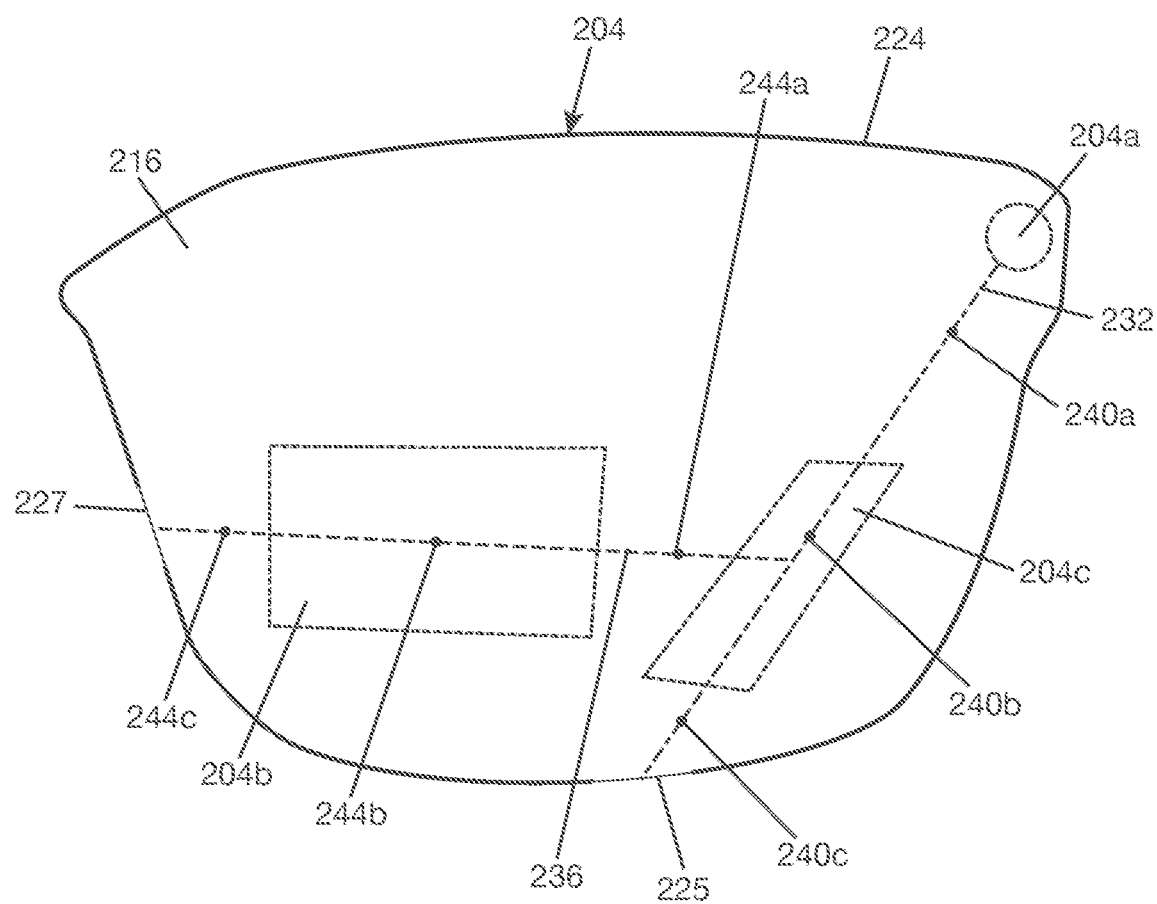
FIG. 7 is a plan view of a lightguide showing example fracture sites that intersect optical paths.

For illustrative purposes, FIG. 7 shows example sites 240*a*, 240*b*, 240*c* where fractures may cross primary optical path 232 if lightguide 204 has fractures. Site 240*a* is located somewhere on the portion of primary optical path 232 between input region 204*a* and fold region 204*c*. Site 240*b* is located somewhere on the portion of primary optical path 232 in fold region 204*c*. Site 240*c* is located somewhere on the portion of primary optical path 232 after fold region 204*c*. A fracture that crosses any of sites 240*a*, 240*b*, 240*c* will interrupt propagation of light along primary optical path 232, diminishing the amount of light that reaches perimeter surface portion 225 from primary optical path 232. A fracture that crosses site 240*a* will interrupt diversion of light from primary optical path 232 to branch optical path 236, diminishing the amount of light that reaches perimeter surface portion 227 from branch optical path 236.

FIG. 7 also shows example sites 244*a*, 244*b*, 244*c* where fractures may cross branch optical path 236 if lightguide 204 has fractures. Site 244*a* is located somewhere in a portion of branch optical path 236 between fold region 204*c* and output region 204*b*. Site 244*b* is located somewhere in a portion of branch optical path 236 in output region 204*b*. Site 244*c* is located after output region 204*b*. A fracture that crosses any of sites 244*a*, 244*b*, 244*c* will interrupt propagation of light along branch optical path 236, diminishing the amount of light that reaches perimeter surface portion 227 from branch optical path 236.

Thus, for display combiner 200 shown in FIG. 3, if a fracture crosses primary optical path 232 anywhere, the amount of light that reaches perimeter surface portion 225 from primary optical path 232 will be diminished compared to if there are no fractures that cross primary optical path 232. Also, if a fracture crosses branch optical path 236 anywhere, the amount of light that reaches perimeter surface portion 227 from branch optical path 236 will be diminished compared to if there are no fractures that cross branch optical path 236. Thus, fractures in lightguide 204, if they occur, can modulate the amount of light that reaches perimeter surface portions 225, 227 from optical paths 232, 236, respectively.

For display combiner 200' variation shown in FIG. 5, if a fracture crosses primary optical path 232' anywhere, the amount of light that reaches perimeter surface portion 225' from primary optical path 232' will be diminished compared to if there are no fractures that cross primary optical path 232'. Also, if a fracture crosses branch optical path 236' anywhere, the amount of light that reaches perimeter surface portion 227' from branch optical path 236' will be diminished compared to if there are no fractures that cross branch optical path 236'. Thus, fractures in lightguide 204, if they occur, can modulate the amount of light that reaches perimeter surface portions 225', 227' from optical paths 232', 236'.

With respect to detecting fractures, the main difference between display combiner 200 in FIG. 3 and display combiner 200' variation in FIG. 5 is the location of the perimeter surface portions on lightguide 204. In FIG. 5, perimeter surface portion 225' that is aligned with primary optical path 232' is located at the bottom of lightguide 204, and perimeter surface portion 227' that is aligned with branch optical path 236' is located at the side of lightguide 204—these locations are transposed for corresponding perimeter surface portions 225, 227 in FIG. 3.

For the dual EPE combiner 200" variation shown in FIG. 6, if a fracture crosses first primary optical path 232*a* anywhere, the amount of light that reaches perimeter surface portion 225*a* from first primary optical path 232*a* will be diminished compared to if there are no fractures that cross primary optical path 232*a*. If a fracture crosses first branch optical path 236*a* anywhere, the amount of light that reaches perimeter surface portion 227*a* from first branch optical path 236*a* will be diminished compared to if there are no fractures that cross first branch optical path 236*a*. Similarly, if a fracture crosses second primary optical path 232*b* anywhere, the amount of light that reaches perimeter surface portion 225*b* from second primary optical path 232*b* will be diminished compared to if there are no fractures that cross second primary optical path 232*b*. Also, if a fracture crosses second branch optical path 236*b* anywhere, the amount of light that reaches perimeter surface portion 227*b* from second branch optical path 236*b* will be diminished compared to if there are no fractures that cross second branch optical path 236*b*. Thus, fractures in lightguide 204, if they occur, can modulate the amount of light that reaches perimeter surface portions 225*a*, 225*b*, 227*a*, 227*b* from primary optical paths 232*a*, 232*b* and branch optical paths 236*a*, 236*b*, respectively.

From the examples above, fractures in lightguide 204, if they occur, can modulate the amount of light that reaches perimeter surface portions (e.g., 225, 227 in FIG. 3; 225', 227' in FIG. 5; 225*a*, 227*a*, 225*b*, 227*b* in FIG. 6) that are aligned with optical paths (e.g., 232, 236 in FIG. 3; 232', 236' in FIG. 5; 232*a*, 236*a*, 232*b*, 236*b* in FIG. 6) within the lightguide. By monitoring the changes in the amount of light that reach perimeter surface portions of lightguide 204 from known optical paths within lightguide 204, it is possible to determine whether lightguide 204 has fractured or not. This monitoring will detect fractures within the lightguide that cross the known optical paths but may not detect other fractures within the lightguide that do not cross the known optical paths. However, the optical paths monitored can be the same as the optical paths carrying display light so that any faults detected can be a reliable indication of laser light leakage that requires mitigating actions to be taken.

Figure 8:
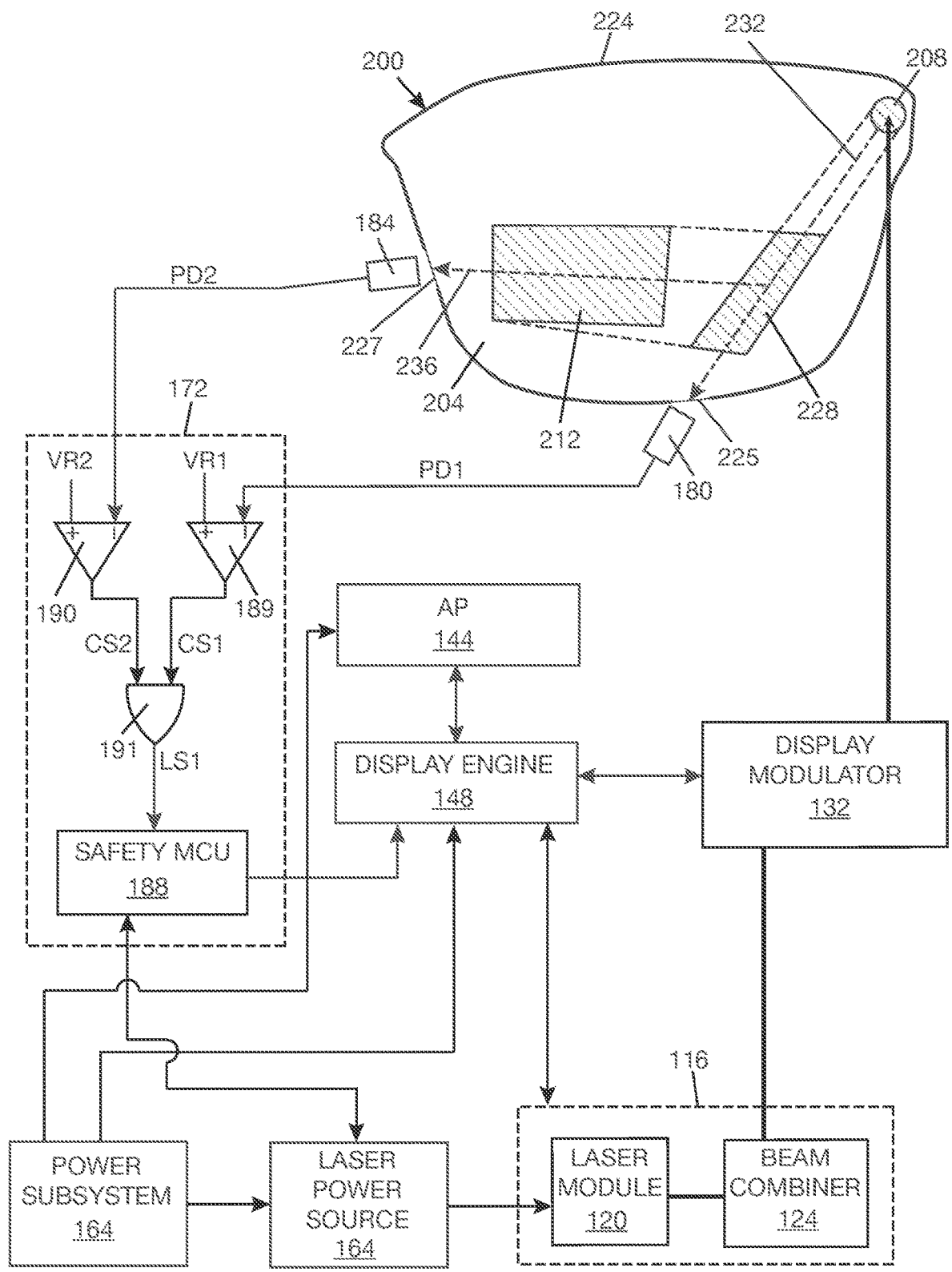
FIG. 8 is a schematic portion of a WHUD including a single EPE combiner and an optical path fault (OPF) detection system.

FIG. 8 shows a portion of WHUD 100 with an optical path fault detection (OPFD) system based on the principles described above. In FIG. 8, photodetector 180 is positioned to detect light that reaches perimeter surface portion 225 from primary optical path 232, and photodetector 184 is positioned to detect light that reaches perimeter surface portion 227 from branch optical path 236. In this implementation, photodetectors 180, 184 are responsive to laser light emitted by at least one laser source in laser module 120. In one example, AP 144 may run an OPF test routine that includes providing a test image to display engine 148—the test image may be a point, a geometric shape, or a pattern, and pixels of the test image may be set to white, although this is not strictly necessary. Upon receiving the image data, display engine 148 would control light engine 116 to generate test light according to the test image data and would control display modulator 132 to redirect the test light to in-coupler according to the test image data. At in-coupler 208, the test light would be coupled into lightguide 204. Photodetectors 180, 184 would output signals that are representative of the amount (or intensity) of the light that reaches edge surface portions 225, 227 from corresponding optical paths 232, 236. The output signals of photodetectors 180, 184 may be interpreted to determine if there are breaks in optical paths 232, 236 that could indicate the presence of fractures in lightguide 204.

In one implementation, laser safety circuit 172 receives the outputs of photodetectors 180 184, compares each of the photodetector outputs to a threshold, and generates an output signal that is representative of this comparison. In one implementation, an optical path within the lightguide is considered to have a fault if an intensity detected by the photodetector associated with the optical path is below an associated threshold—that is, little to no light is detected from the optical path. In one example, laser safety circuit 172 includes a first comparator 189 having a negative input connected to receive an output signal PD1 from photodetector 180 and a positive input connected to a reference voltage signal VR1. PD1 indicates the intensity of light detected by photodetector 180. VR1 indicates the threshold against which the output of photodetector 180 is to be compared. Comparator 189 generates an output signal CS1 that is representative of a comparison between output signal PD1 and reference voltage VR1. Under normal conditions where there are no breaks in optical path 232, PD1 will be higher than VR1, and CS1 will be LOW. PD1 will drop in response to breaks in optical path 232 that disrupt propagation of light along optical path 232. If PD1 drops below VR1, CS1 will go HIGH.

Laser safety circuit 172 may further include a second comparator 190 having a negative input connected to receive an output signal PD2 from photodetector 184 and a positive input connected to a reference voltage signal VR2. PD2 indicates the intensity of light detected by photodetector 184. VR2 indicates the threshold against which the output of photodetector 184 is to be compared. Comparator 190 generates an output signal CS2 that is representative of a comparison between output signal PD2 and reference voltage VR2. Under normal conditions where there are no breaks in optical path 236, PD2 will be higher than VR2, and CS2 will be LOW. PD2 will drop in response to breaks in optical path 236 that disrupt propagation of light along optical path 236. If PD2 drops below VR2, CS2 will go HIGH.

The threshold indicated by reference voltage VR2 may be the same or may be different from the threshold indicated by reference voltage VR1. The thresholds against which PD1 and PD2 are compared should take into account environmental light that may artificially inflate the intensity of the light detected. In some cases, using a narrow bandwidth test light and tuning the photodetectors to respond to the narrow bandwidth may improve the accuracy of the detection by the photodetectors. The thresholds (or reference voltages) should be selected such that when the photodetector outputs are below the respective thresholds, this can be taken as an indication that there are faults in the optical paths that the photodetectors are monitoring. The thresholds may be determined experimentally, e.g., by measuring light detected with and without faults in the optical paths, or by modeling.

In one example, comparator signals CS1, CS2 are fed to an OR gate 191. Either or both of CS1 and CS2 going HIGH will cause an output signal LS1 of OR gate 191 to go HIGH. Output signal LS1 of OR gate 191 may be fed to a port of a safety microcontroller (MCU) 188, which is part of laser safety circuit 172. If output signal LS1 is HIGH, this may trigger an OPF event at safety MCU 188. In response, safety MCU 188 may send a laser power shutoff control to laser power source 168. For example, laser power source 168 may be coupled to laser module 120 by a switch, and the laser power shutoff control may open the switch so that laser power source 164 no longer provides current to the laser sources in laser module 120. Also, safety MCU 188 may notify display engine 148 of the OPF event so that display engine 148 can stop sending display controls to display modulator 132 and light engine 116. Alternatively, as previously mentioned, light engine 116 may have a low power mode and a normal mode, and a response to the OPF event may be to send a control to laser power source 168 that changes the power mode of light engine 116 from a normal power mode to a low power mode. In the low power mode, display engine 148 may drive display modulator 132 and light engine 114 with low resolution image data.

In FIG. 8, two photodetectors 180, 184 are used to monitor light that reaches perimeter surface portions of lightguide 204 from optical paths within lightguide 204. In general, one or more photodetectors may be used to monitor light that reaches perimeter surface portion(s) of lightguide 204 from one or more known optical paths within lightguide. For example, photodetector 180 may be omitted in FIG. 8, and photodetector 184 alone may be used to detect light that reaches perimeter surface 227 from branch optical path 236. This would allow detection of fractures that cross branch optical path 236 and fractures that cross a portion of primary optical path 232 between in-coupler 208 and EPE 228. Alternatively, if the display combiner does not have an EPE, this simplifies to one optical path that runs from the input region to the output region to a portion of the perimeter surface of the lightguide, requiring one photodetector for OPF testing.

Figure 9:
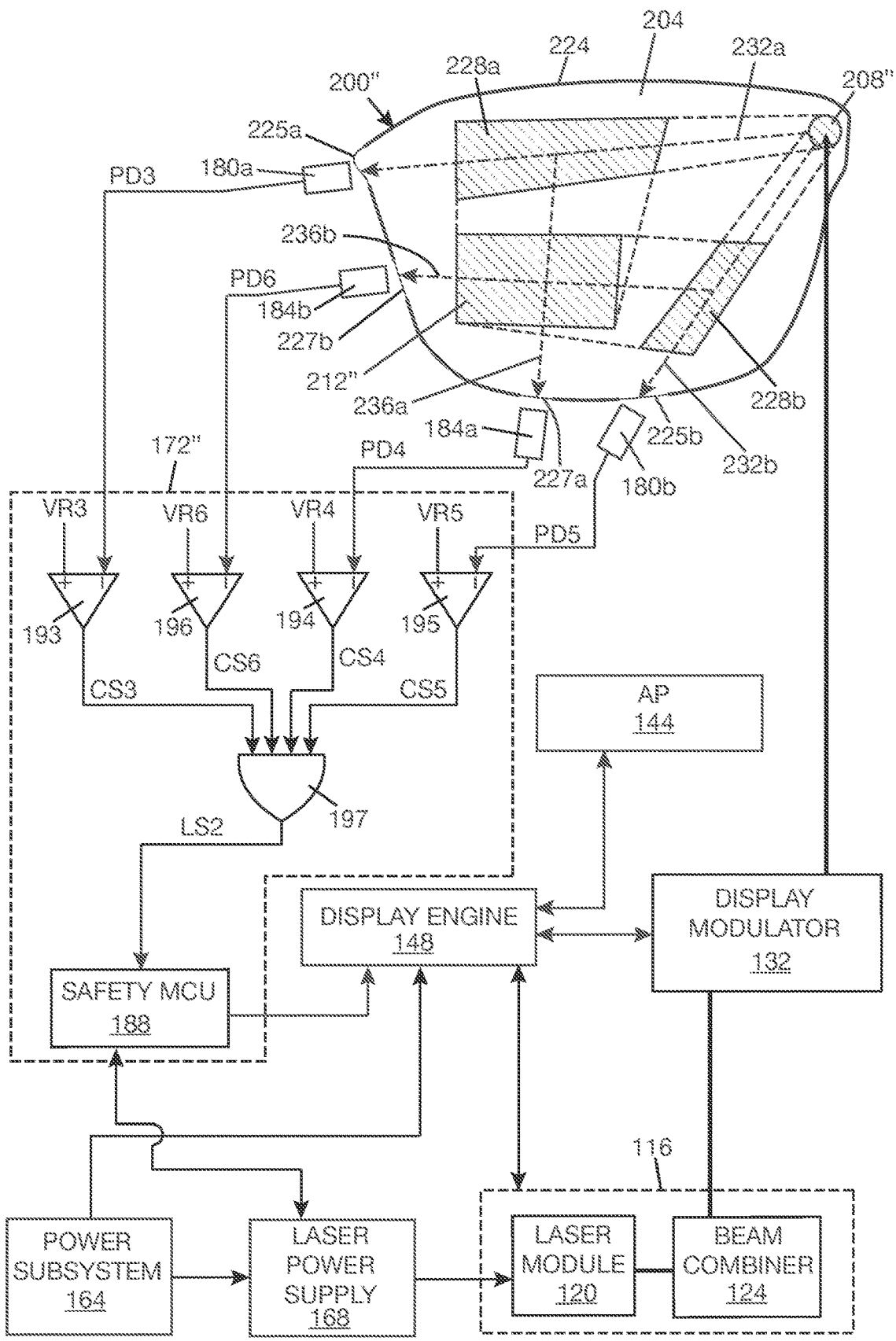
FIG. 9 is a schematic portion of a WHUD including a dual EPE combiner and an OPF detection system.

Display combiner 200" variation in FIG. 6 can be monitored for OPF events in much the same manner described for display combiner 200 above. Referring to FIG. 9, photodetectors 180a, 184a, 180b 184b are positioned to detect light that reaches perimeter surface portions 225a, 227a, 225b, 227b from optical paths 232a, 236a, 232b, 236b, respectively. Photodetectors 180a, 184a, 180b, 184b are responsive to light emitted by at least one laser source in laser module 120. To detect if there are fractures in lightguide 204, a test light may be generated by at least one of the laser sources in laser module 120 and directed to display modulator 132, which would redirect the test light to in-coupler

208. Photodetectors 180*a*, 184*a*, 180*b*, 184*b* generate output signals PD3, PD4, PD5, PD6, which are representative of the amount (or intensity) of light that reaches perimeter surface portions 225*a*, 227*a*, 225*b*, 227*b* from optical paths 232*a*, 236*a*, 232*b*, 236*b*, respectively. In one implementation, laser safety circuit 172" receives the photodetector outputs PD3, PD4, PD5, PD6, compares each of the photodetector outputs to a respective threshold, and generates an output signal that is representative of this comparison.

In one example, laser safety circuit 172" includes a first comparator 193 having a negative input connected to receive output signal PD3 from photodetector 180*a* and a positive input connected to a reference voltage VR3. PD3 indicates the intensity of light detected by photodetector 180*a*. VR3 corresponds to the threshold against which the output of photodetector 180*a* is to be compared. Comparator 193 generates an output signal CS3 that is representative of a comparison between output signal PD3 and reference voltage VR3. Under normal conditions where there are no breaks in first primary optical path 232*a*, PD3 will be higher than VR3, and CS3 will be LOW. PD3 will drop in response to breaks in optical path 232*a*. If PD3 drops below VR3, CS3 will go HIGH.

Laser safety circuit 172" may further include a second comparator 194 that takes output signal PD4 from photodetector 184*a* and reference voltage VR4 as inputs and generates an output signal CS4 that is representative of a comparison between output signal PD4 and reference voltage VR4. Under normal conditions where there are no breaks in first branch optical path 236*a*, PD4 will be higher than VR4, and CS4 will be LOW.

Laser safety circuit 172" may further include a third comparator 195 that takes output signal PD4 from photodetector 180*b* and reference voltage VR5 as inputs and generates an output signal CS5 that is representative of a comparison between output signal PD5 and reference voltage VR5. Under normal conditions where there are no breaks in second primary optical path 232*b*, PD5 will be higher than VR5, and CS5 will be LOW.

Laser safety circuit 172" may further include a fourth comparator 196 that takes output signal PD6 from photodetector 184*b* and reference voltage VR6 as inputs and generates an output signal CS6 that is representative of a comparison between output signal PD6 and reference voltage VR6. Under normal conditions where there are no breaks in second branch optical path 236*b*, PD6 will be higher than VR6, and CS6 will be LOW.

In one example, comparator signals CS3, CS4, CS5, CS6 are fed to an OR gate 197. Any of CS1 and CS2 going HIGH will cause an output signal LS2 of OR gate 197 to go HIGH. Output signal LS2 of OR gate 197 may be fed to safety MCU 188. Safety MCU 188 upon receiving a HIGH signal from OR gate 197 may trigger an OPF event. Safety MCU 188 may act on the OPF event as previously explained with reference to FIG. 8.

In FIG. 9, four photodetectors 180*a*, 184*a*, 180*b*, 184*b* are used to monitor light that reaches four perimeter surface portions from four different optical paths within lightguide 204. In alternative implementations, less than four photodetectors may be used to monitor light from less than four perimeter surface portions of lightguide 204. For instance, it may suffice to use only two photodetectors to monitor light that reaches two perimeter surface portions from two optical paths within the lightguide. For example, photodetectors 180*a*, 180*b* alone may be used to monitor light that reaches perimeter surface portions 225*a*, 225*b*. Alternatively, photodetectors 180*a*, 184*a* alone may be used to monitor light that reaches perimeter surface portions 225*a*, 227*a*. Alternatively, photodetectors 180*b*, 184*b* alone may be used to monitor light that reaches perimeter surface portions 225*b*, 227*b*. Where two photodetectors are used, laser safety circuit 172 in FIG. 8 may be used instead of laser safety circuit 172" in FIG. 9. There is also the possibility of using only one photodetector to monitor the light that reaches one of perimeter surface portions 225*a*, 227*a*, 225*b*, 227*b* and basing assessment of an OPF event on the output of the single photodetector. In general, the greater the number of optical paths monitored, the more robust may be the lightguide fracture detection as it would allow more coverage of the lightguide.

In the WHUD of FIGS. 8 and 9, the same optical paths are used for OPF testing and normal transfer of display images. This generally means that when OPF testing is being carried out, display images are not being sent, and vice versa. In one implementation, the WHUD may be operated by carrying out OPF testing prior to each instance of sending a display image to the eye through the display combiner. If the OPF testing does not indicate an OPF event, then the display image may be sent immediately after the testing. In another implementation, the WHUD may be operated by carrying out an OPF testing upon starting or waking up the WHUD and carrying out subsequent OPF testing at intervals during use of the WHUD—the intervals may be preset or based on triggering activities. In the case where OPF testing shares the same optical paths used for normal transfer of display images, low power visible light may be used as the test light so as to minimize visibility of the test light to the user. There is the possibility of using infrared as the test light, which would be invisible to the eye. However, an optical path that is tuned for visible light may not work for infrared light because of the much longer wavelength of the infrared light compared to the visible light.

Figure 10:
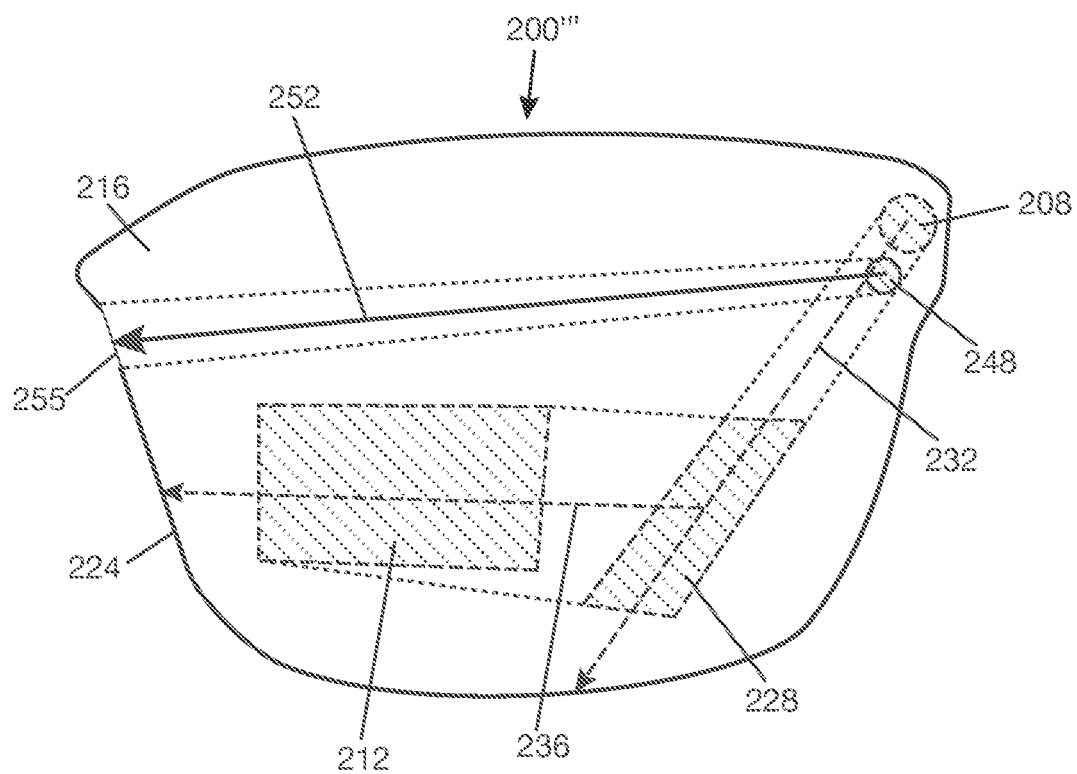
FIG. 10 is a plan view of a display combiner showing an optical path for OPF testing that is separate from optical paths for transferring display images.

In another approach, one or more separate optical paths may be provided for OPF testing so that OPF testing may be carried out simultaneously with transferring display images to the eye. In this alternative approach, the separate optical path(s) for OPF testing may be tuned for infrared light, which would enable invisible OPF testing. For illustrative purposes, FIG. 10 shows a display combiner 200''' having an optical path for OPF testing that is separate from optical paths for transferring display images. In addition to the features of display combiner 200 (in FIG. 3) previously described, display combiner 200''' includes an in-coupler 248 that is positioned to couple a test light into lightguide 204. For discussion purposes, in-coupler 248 may be referred to as "auxiliary in-coupler", and previously described in-coupler 208 may be referred to as "primary in-coupler". In one example, auxiliary in-coupler 248 receives a test light and couples the test light into an auxiliary optical path 252 within lightguide 204. Auxiliary optical path 252 is separate from primary and branch optical paths 232, 236 used to transfer display images. To detect an OPF event, light that reaches portion 255 of perimeter surface 224 of lightguide 204 from auxiliary optical path 232 may be monitored.

Figure 11:
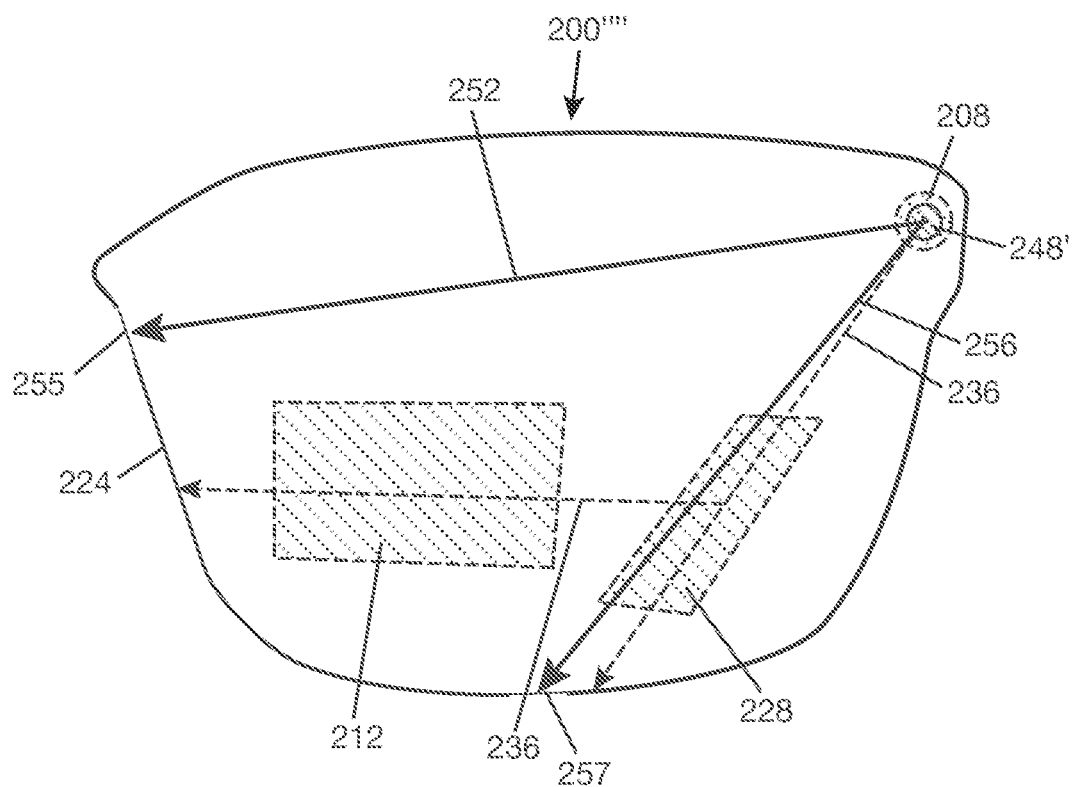
FIG. 11 is a plan view of a display combiner showing two optical paths for OPF testing that are separate from optical paths for transferring display images.

FIG. 11 shows a display combiner 200'''' variation where auxiliary in-coupler 248' couples a test light into two auxiliary optical paths 252, 256 within lightguide 204. Auxiliary optical paths 252, 256 are separate from primary and branch optical paths 232, 236. To detect an OPF event, light that reaches perimeter surface portions 255, 257 from auxiliary optical paths 252, 256 may be monitored. In FIG. 11, even though EPE 228 appears to be aligned with auxiliary optical path 256, EPE 228 will typically be designed to be unresponsive to the light that auxiliary optical path 256 is carrying. For example, auxiliary optical path 256 may carry infrared light, while EPE 228 is designed to be responsive to visible light. In general, it is not expected that EPE 228 will redirect the light in auxiliary optical path 256 towards out-coupler 212. FIG. 11 also shows that it is possible to have auxiliary optical paths 252, 256 proximate primary and branch optical paths 232, 236, respectively, such that fractures that cross primary and branch optical paths 232, 236 will most likely also cross auxiliary optical paths 252, 256.

FIG. 10 shows auxiliary in-coupler 248 laterally offset from primary in-coupler 208 as an example. FIG. 11 shows a different example where auxiliary in-coupler 248' is stacked with primary in-coupler 208. Both auxiliary in-coupler 248 (248') and primary in-coupler 208 may be located on or proximate the same major surface (i.e., front or back surface) of lightguide 204. Alternatively, auxiliary in-coupler 248 (248') and primary in-coupler 208 may be located on or proximate different major surfaces of lightguide 204, e.g., auxiliary in-coupler on the front surface and primary in-coupler 208 on the back surface, or vice versa.

Auxiliary in-coupler 248 (248') may be made with optical grating as previously described for in-coupler 208. In general, auxiliary in-coupler 248 (248') may be designed to be responsive to light in a first wavelength range and unresponsive to light in a second wavelength range, and primary in-coupler 208 may be designed to be responsive to light in the second wavelength range and unresponsive to the light in the first wavelength range. "Responsive" herein means that the coupler redirects the light and may modify the light while redirecting the light. "Unresponsive" herein means that the coupler transmits or reflects the light generally without modifying the light. The first wavelength range to which auxiliary in-coupler 248 (248') is responsive may be an infrared wavelength range, while the second wavelength range to which primary in-coupler 208 is responsive is a visible wavelength range. Alternatively, the first wavelength range to which auxiliary in-coupler 248 (248') is responsive may be a subset of the visible wavelength range, and the second wavelength to which primary in-coupler 208 is responsive may be another subset of the visible wavelength range.

Figure 12:
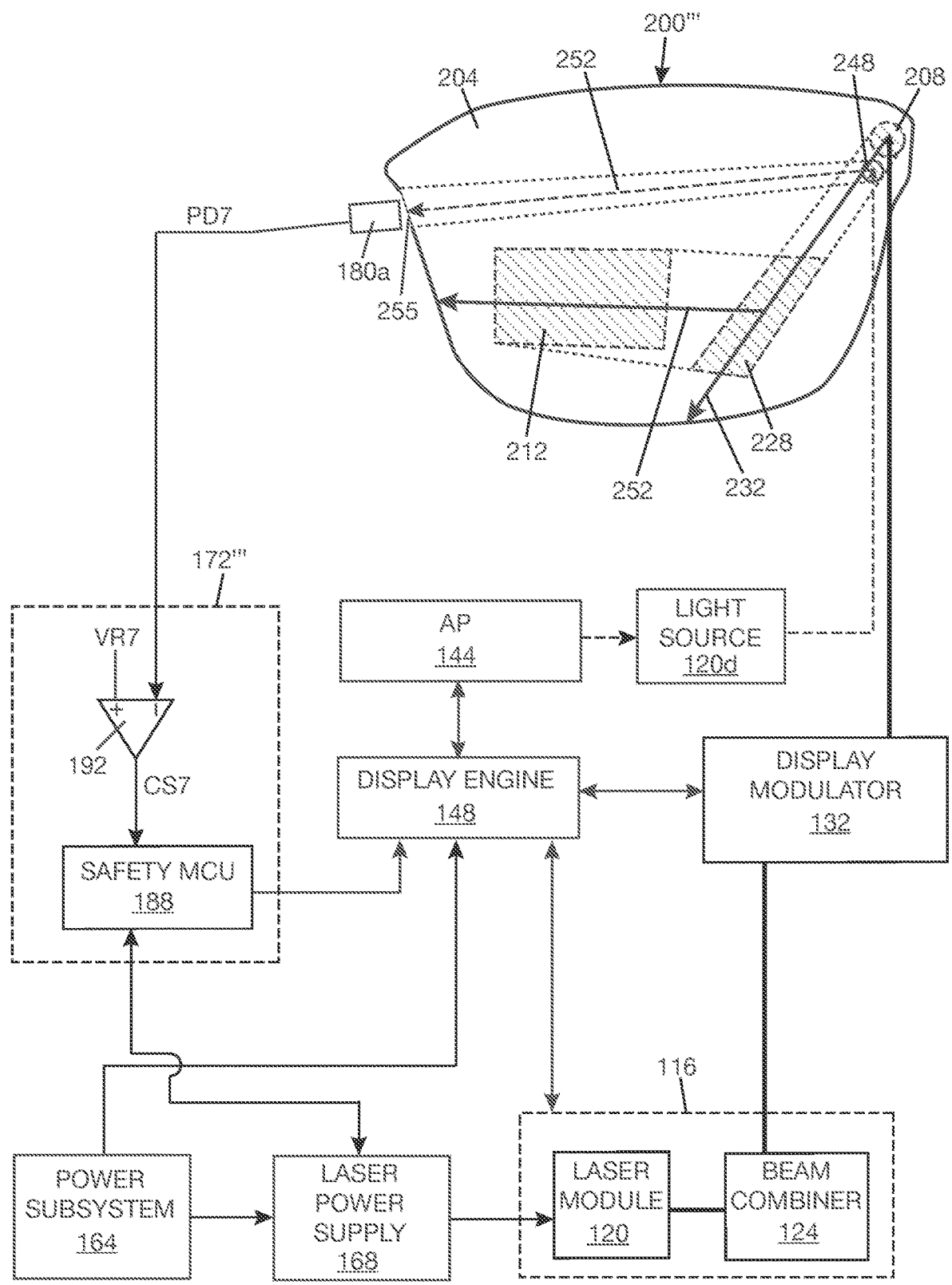
FIG. 12 is a schematic portion of a WHUD including a display combiner with a dedicated optical path for OPF testing.

FIG. 12 shows a photodetector 180*a* positioned to detect light that reaches perimeter surface portion 255 of lightguide 204 from auxiliary optical path 252 within lightguide 204. In this case, laser safety circuit 172''' may include a comparator 192 that compares the output PD7 of photodetector 180*a* to a threshold (reference voltage VR7) and generates a signal CS7 that indicates whether or not there are breaks in auxiliary optical path 252. CS7 is received by safety MCU 188, which may generate an OPF event if the conditions for an OPF event are met. OPF testing may be carried out simultaneously with providing display light to primary in-coupler 208. If the output of laser safety circuit 172''' indicates an OPF event, safety MCU 188 may stop light engine 116 from outputting light or may put light engine 116 in a low power mode as previously described.

Figure 13:
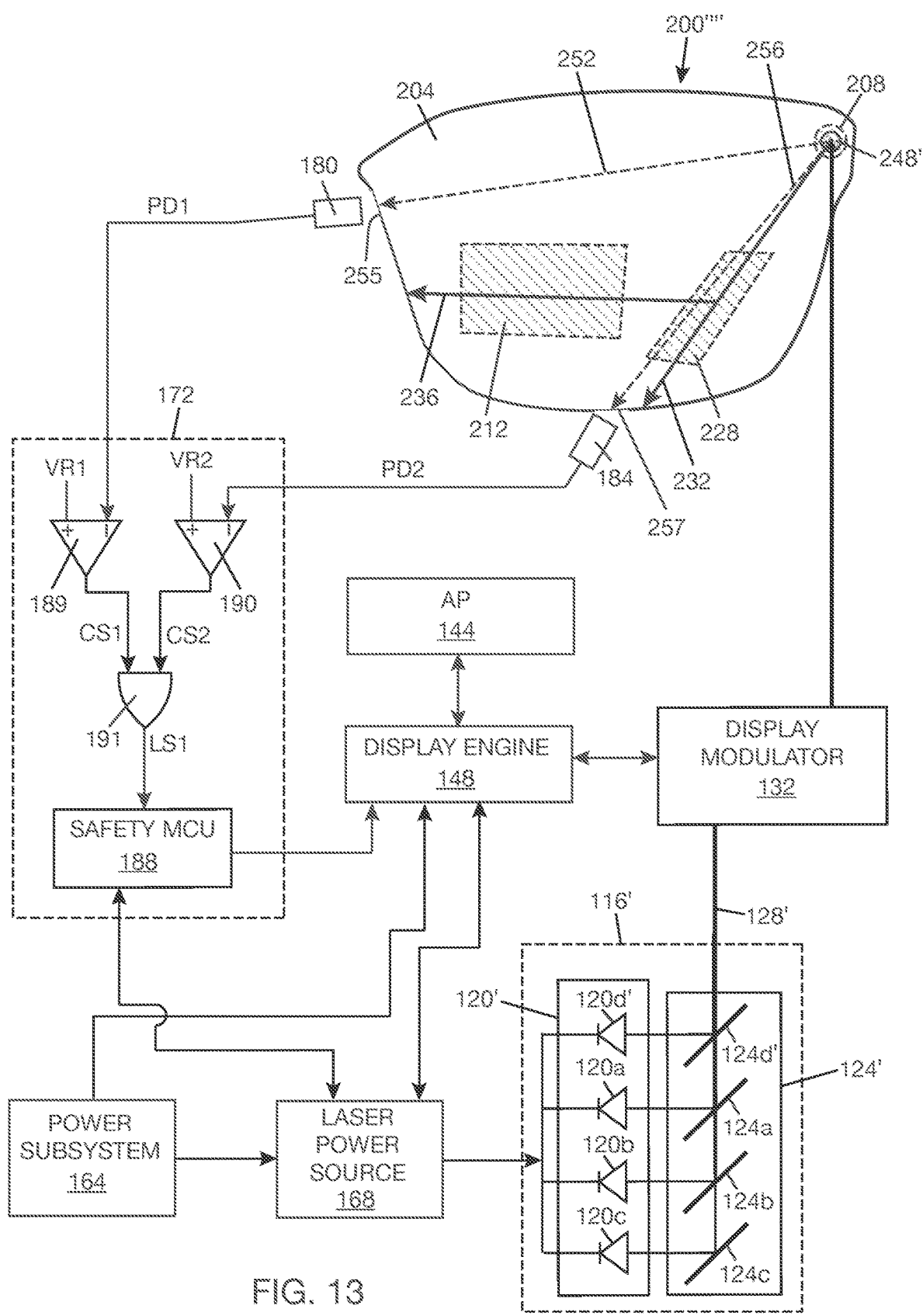
FIG. 13 is a schematic portion of a WHUD showing a light engine that provides light to dedicated optical paths for OPF testing and dedicated optical paths for transferring display images.

FIG. 12 shows light source 120*d* outside of laser module 120, which means that test light is not aggregated with the output of light engine 116 and may take a different sub-path of support frame optical path compared to light outputted by light engine 116. In some cases, it may be easier to package light source 120*d* with laser module 120 so that the test light and display light share the same optical path from the light engine to the display combiner. For illustrative purposes, in FIG. 13, laser module 120' includes laser source 120*d'* for generating test light. Beam combiner 124' includes optical elements 124*a*, 124*b*, 124*c*, 124*d'* to combine the test light generated by laser source 120*d'* with the display light generated by laser sources 120*a*, 120*b*, 120*c*. The aggregated beam 128' outputted by beam combiner 124' is directed to display modulator 132, which redirects the light to the in-couplers 208, 248'. Auxiliary in-coupler 248' will couple the test light portion of the incident light into auxiliary optical paths 252, 256. Primary in-coupler 208 will couple the display light portion of the incident light into primary optical path 232. In one example, laser source 120*d'* that generates the test light is an infrared laser source, and laser sources 120*a*, 120*b*, 120*c* that generate the display light may be visible laser sources. In another example, all of the laser sources may be visible laser sources. FIG. 13 is illustrated using display combiner 200'''' that has two auxiliary optical paths 252, 256. Photodetectors 180, 184 and laser safety circuit 172 previously described with respect to FIG. 8 may be used to monitor the auxiliary optical paths for faults.

Figure 14:
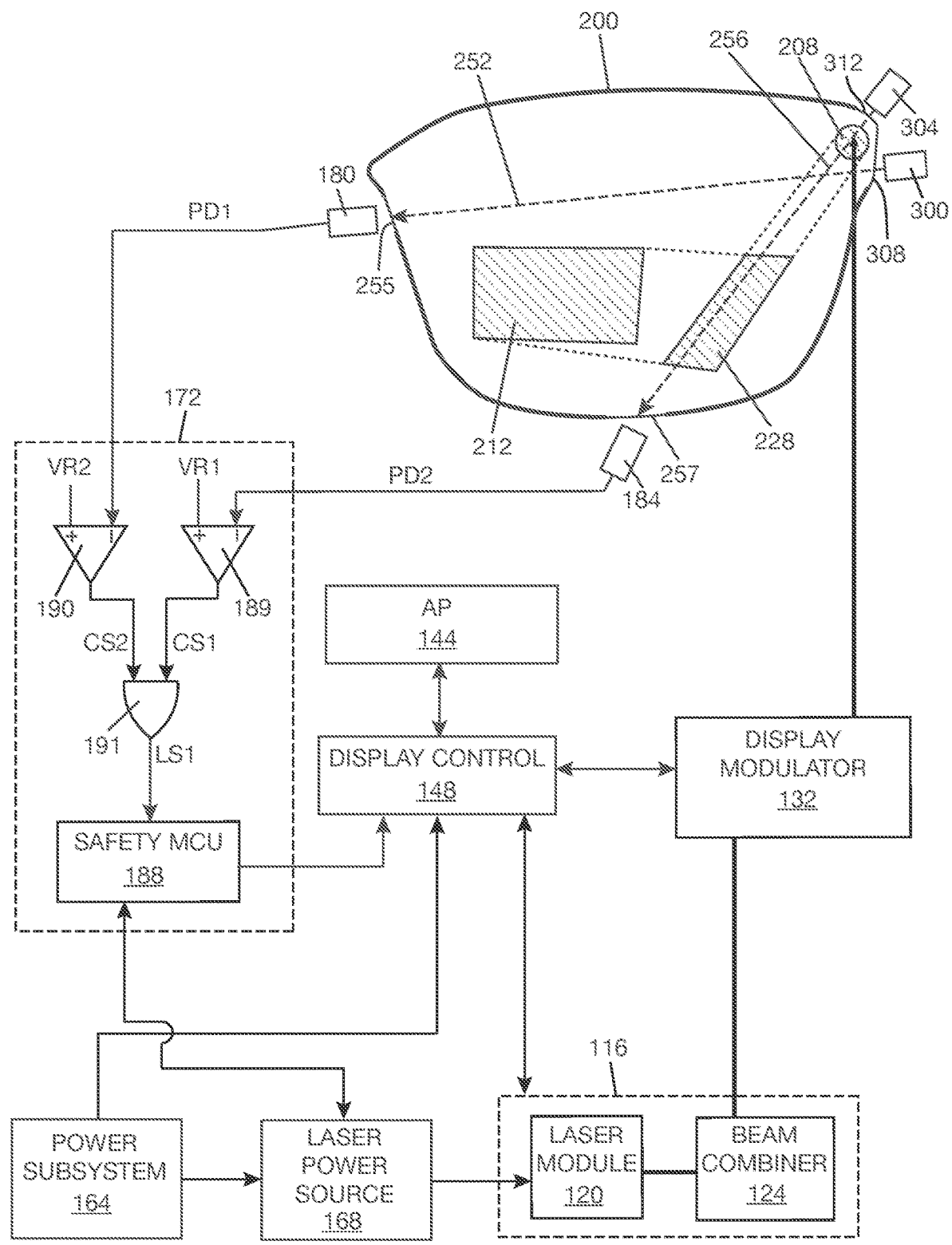
FIG. 14 is a schematic portion of a WHUD showing light sources positioned to direct light into a lightguide for OPF testing.

Testing light may be coupled into auxiliary optical paths without use of an in-coupler. FIG. 14 shows light sources 300, 304 positioned to direct light into auxiliary optical paths 252, 256 through portions 308, 312 of perimeter surface 224 of lightguide 204. The test light directed into auxiliary optical paths 252, 256 travels to perimeter surface portions 255, 257, respectively. Light that reaches perimeter surface portions 255, 257 can be detected by photodetectors 180, 184, respectively. Laser safety circuit 172 can receive the outputs of photodetectors 180, 184 and determine if there is an OPF event that requires further action as previously explained. Light sources 300, 304 may be laser sources, such as laser diodes, or other type of light sources, such as light emitting diodes. Light sources 300, 304 may be visible light sources or infrared light sources. The WHUD shown in FIG. 14 may be alternatively implemented with one light source and one auxiliary optical path or with more than two light sources and more than two auxiliary optical paths.

For each WHUD variation described in FIGS. 8, 9, 12, 13, and 14, all the components shown other than lens 112 and photodetectors (180, 184 in FIGS. 8, 13, and 14; 180*a* in FIGS. 9 and 12; 180*b*, 184*a*, 184*b* in FIG. 9) may be carried by one or both of the temples (110, 114 in FIG. 1) of the WHUD. Typically, light engine 116 and display modulator 132 will be carried by the same temple. Lens 112 will be carried by the frame front (106 in FIG. 1) of the WHUD, as shown in FIG. 1. For each WHUD variation, the respective photodetectors may be embedded in or carried by a portion of the frame front circumscribing the display lens, as shown at 180, 184 in FIG. 1. In general, the positioning of photodetectors in the frame front should be such that the photodetectors can monitor light that reaches the perimeter of lightguide 204 from known optical paths within the lightguide. For the WHUD variation shown in FIG. 14, light sources 300, 304 can be embedded in or carried by the portion of the front frame circumscribing lens 112 (similar to what is shown in FIG. 1 for photodetectors 180, 184). The portion of the frame front where light sources 300, 304 are carried will be close to the input region of lightguide 204 (i.e., close to where in-coupler 208 is located).

Figure 15:
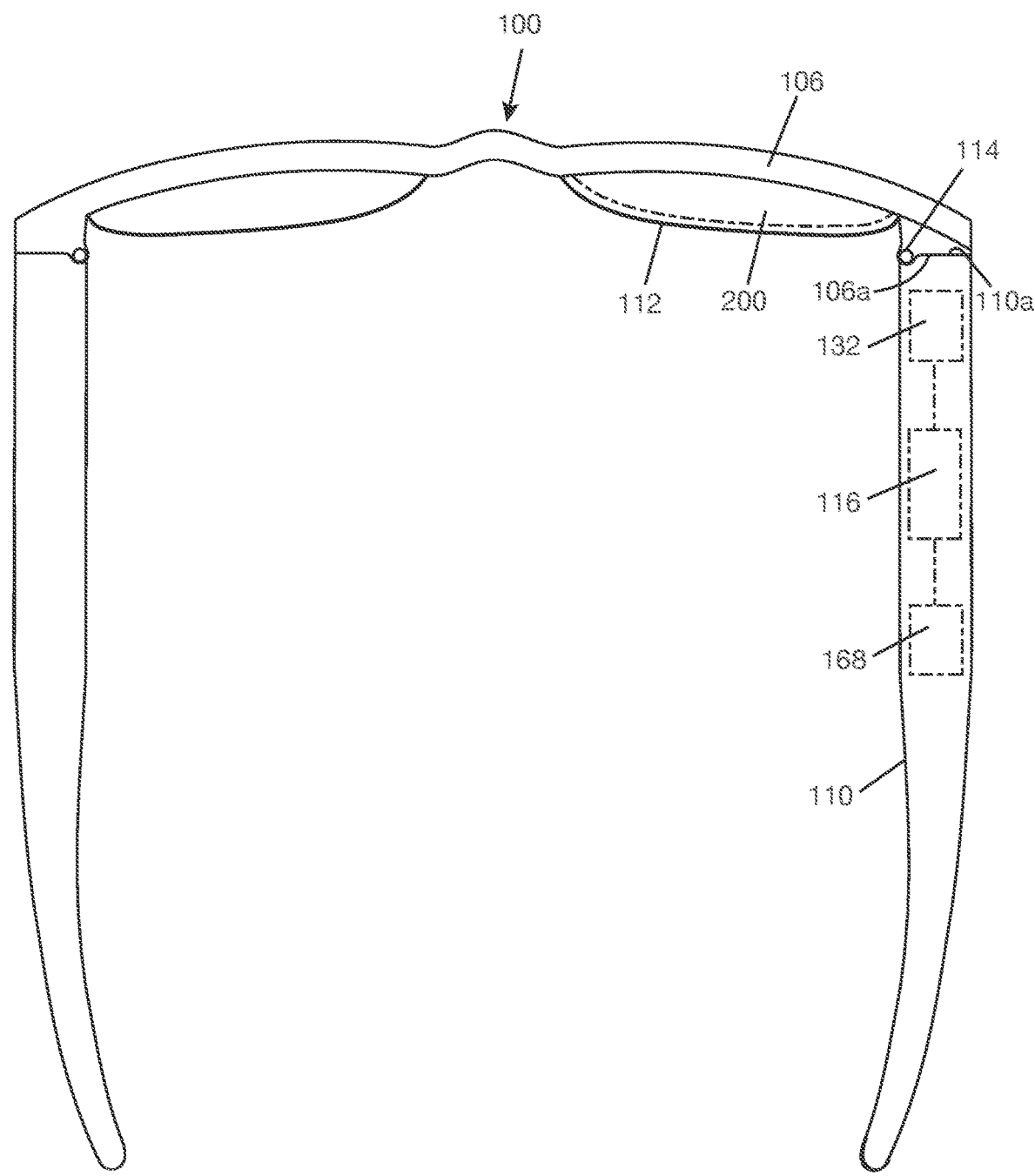
FIG. 15 is a top plan view of a WHUD with the temples in an open position.
Figure 16:
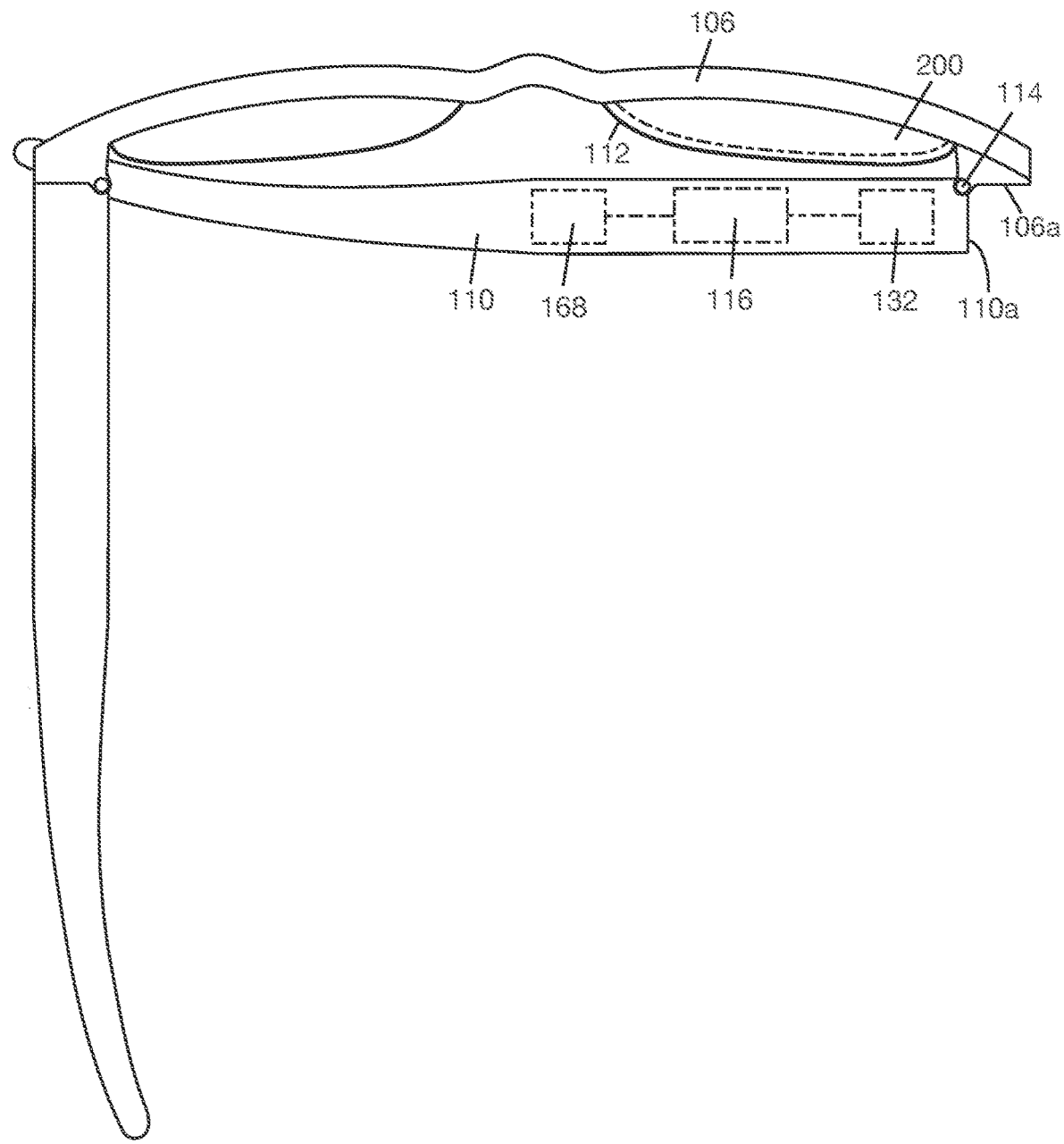
FIG. 16 is a top plan view of a WHUD with one of the temples in an open position and the other in a folded position.

FIG. 15 shows a top plan view of WHUD 100 according to one illustrative implementation. Light engine 116, display modulator 132, laser power source 168 are shown within temple 110. However, not all the components that temple 110 may carry are shown. Temple 110 is coupled to frame front 106 by a hinge 114, which allows temple 110 to be moved between an open position (or extended position), as shown in FIG. 15, and a folded position, as shown in FIG. 16. When temple 110 is in the open position, an opening at a front end 110*a* of temple 110 is aligned with an opening at a back corner 106*a* of frame front 106. Laser light outputted by light engine 116 is directed to display modulator 132, which directs the laser light towards the opening at front end 110*a* of temple 110. Frame front 106 carries display lens 112, which carries display combiner 200 (or a variant thereof). If temple 110 is in the open position, as shown in FIG. 15, the light will reach front end 110*a* of temple 110 and will be able to enter the opening at back corner 106*a* of frame front 106 to reach display combiner 200. Support frame optical path (i.e., the optical path extending from within temple 110 through the opening at the back corner 106*a* of frame front 106 to display combiner 200) will be broken when temple 110 is in the folded position, as shown in FIG. 16, and in at least some intermediate positions between the open and folded positions of the temple.

In some cases, display light coming out of light engine 116 may need to be at an optical power that exceeds Class 1 laser safety limits. The optical power would typically be reduced by the time the light is delivered to the eye due to inefficiencies in the display combiner. However, while traveling along the support frame optical path, the power may exceed Class 1 laser safety limits. If temple 110 is not in the open position, e.g., is in the folded position, the opening at front end 110*a* of temple 110 will be exposed to the environment, as shown in FIG. 16. If light engine 116 is outputting laser light while the opening at front end 110*a* of temple 110 is exposed to the environment, the light outputted by light engine 116 and modulated by display modulator 132 will be directed to the environment rather than to an optical path that is connected to display combiner 200. This means that potentially dangerous laser light may be spilling out of temple 110 to the environment. If the front end of temple 110 is aimed at an eye in this condition, this potentially dangerous laser light could potentially cause eye damage.

It may be possible to install a shutter at the front end of temple 110 that slides over the opening at the front end of temple 110 when temple 110 is in the open position and slides away from the opening when temple 110 is in the folded position. This would avoid potential spilling of laser light to the environment when temple 110 is in the open position. However, it may still be desirable to know when the support frame optical path is no longer defined so that light engine 116 can be prevented from outputting light. In some cases, the same system used to detect faults in optical paths within the lightguide can be used to detect faults in the support frame optical path. If the light used in the OPF testing is carried by temple 110 (e.g., in the systems shown in FIGS. 8, 12, and 13), a test light generated for OPF testing will reach the lightguide of display combiner 200 only if there is a defined support frame optical path from temple 110 to display combiner 200, i.e., the temple is not in the folded position, or if a shutter is used at the front end of the temple, the shutter is not in a closed position. This means that an OPF testing using a light source carried within temple 110 can detect faults in both lightguide and support frame optical paths.

Figure 17:
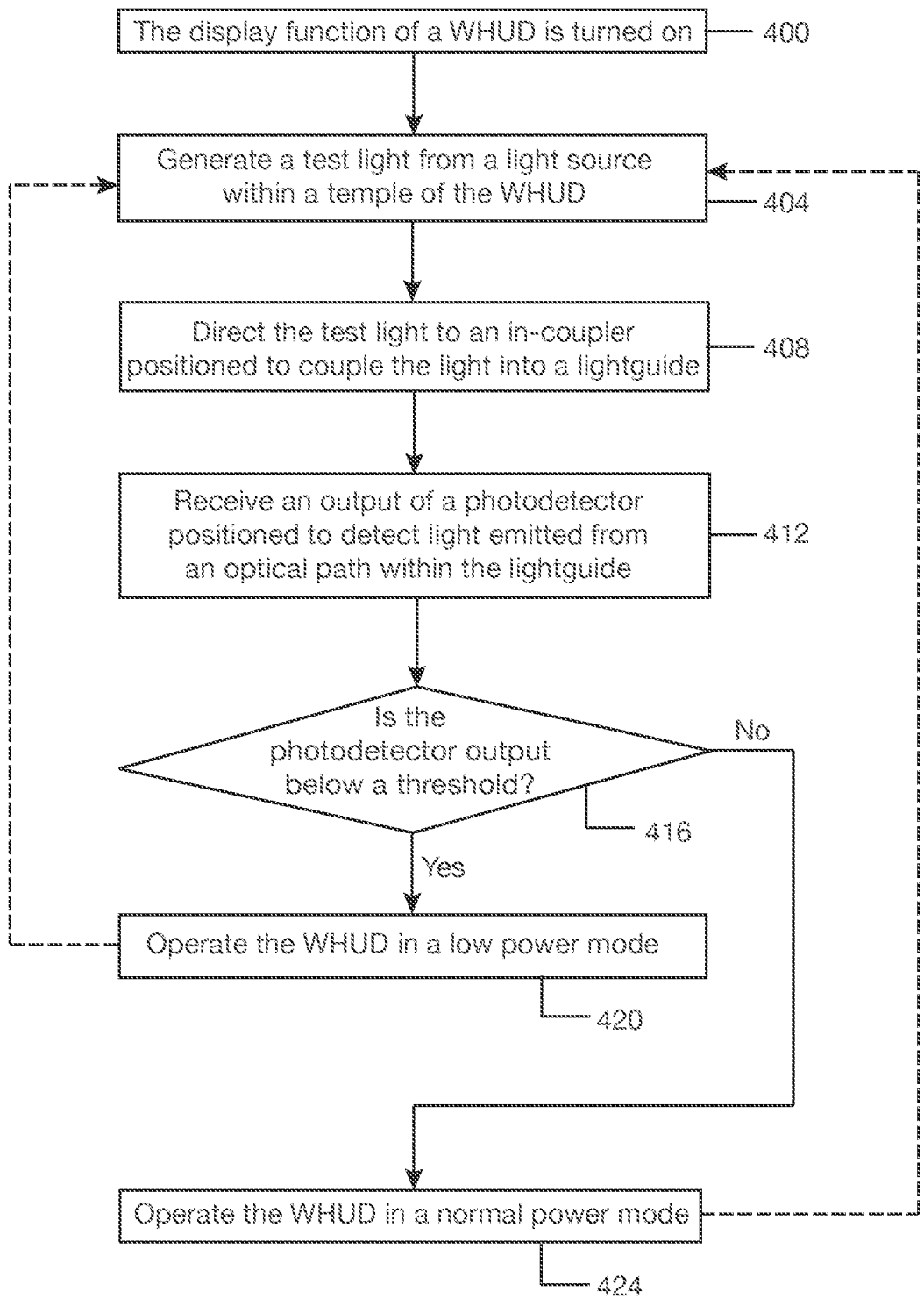
FIG. 17 is a flow diagram showing an example method of operating a WHUD safely.

FIG. 17 is a flow diagram illustrating one example of operating a WHUD safely. It is useful to contemplate the system described in any one of FIGS. 8, 12, and 13 while considering the flow diagram in FIG. 17. At 400, the display is turned on—turning on the display may mean that the display engine (148 in FIGS. 8, 12, 13) is communicatively coupled to the display modulator (132 in FIGS. 8, 12, 13) and light engine (116 in FIGS. 8, 12, 13). The display may be turned on by the user or may be triggered by some application that is running on the WHUD. At 404, in response to the display being turned on, a test light is generated from within the temple carrying the light source for the test light. At 408, the test light is directed to an in-coupler (208, 248, 248' in FIGS. 8, 12, 13) positioned to couple light into a lightguide (208 in FIGS. 8, 12, 13) of the display combiner of the WHUD. At 412, an output of at least one photodetector positioned to detect light emitted from a known optical path within the lightguide is received at the laser safety circuit. At 416, the laser safety circuit (172, 172'' in FIGS. 8, 12, and 13) determines if the output of the photodetector is below a threshold. If the output of the photodetector is below a threshold, then an OPF event is triggered. At 420, in response to the OPF event, a control may be sent to the laser power source (168 in FIGS. 8, 12, 13) to switch the light engine to a low power mode. Alternatively, a control may be sent to the laser power source to stop supplying electrical power to the laser module (120 in FIGS. 8, 12, 13), essentially shutting off the light engine. At some point, OPF testing may be carried out again by returning to act 404. If from the determination of 416 the output of the photodetector is above a threshold, then it may be concluded that there are no faults in the lightguide and support frame optical paths and that the light engine could operate in the normal power mode. While operating in the normal power mode, the WHUD may from time to time return to act 404 to verify that the lightguide and support frame optical paths are still free of faults and that the WHUD can still operate in the normal power mode.

Figure 18:
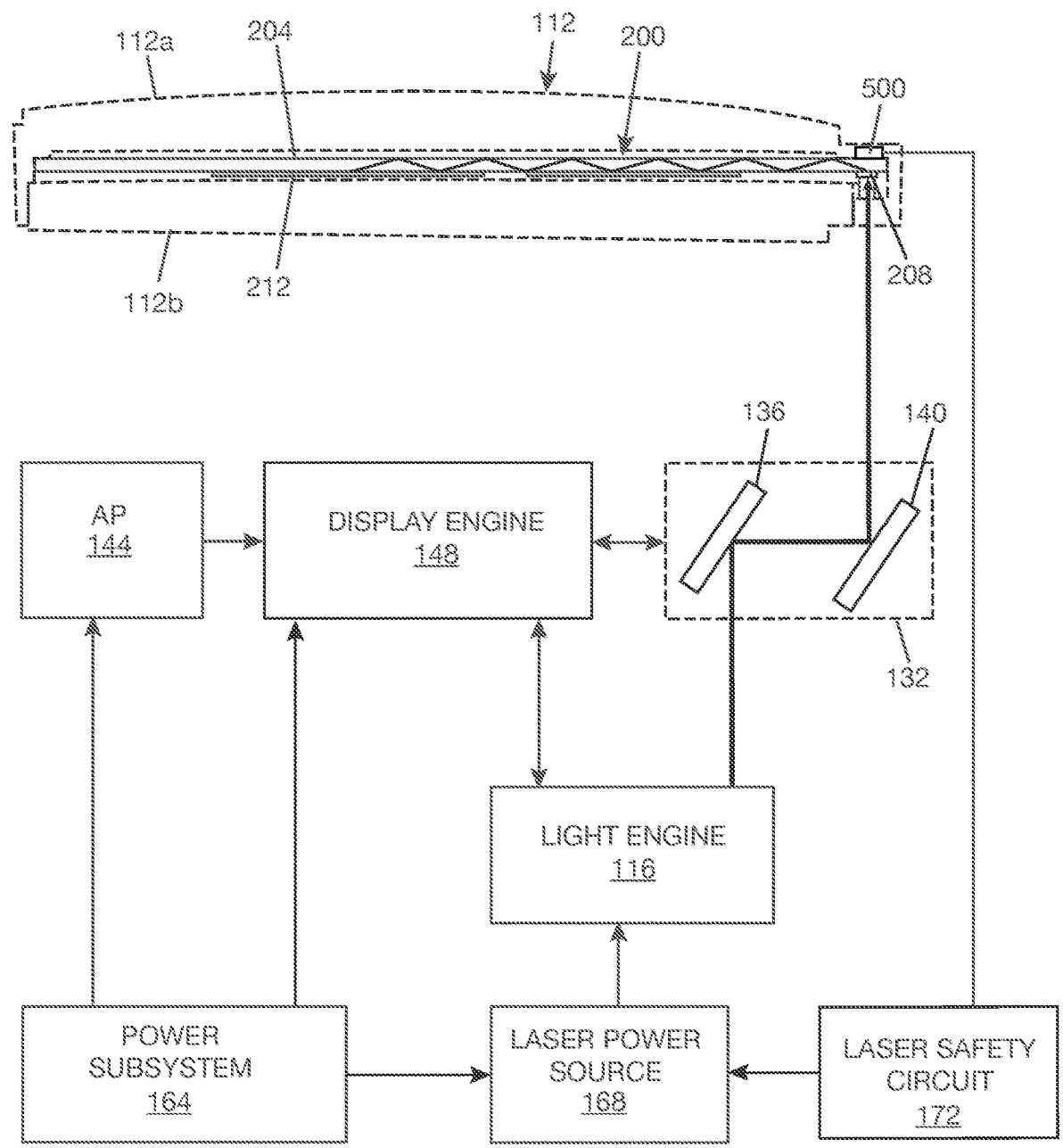
FIG. 18 is a schematic portion of a WHUD with a photodetector behind an in-coupler for optical fault detection in a support frame optical path.

FIG. 18 shows a system that may be used to test a support frame optical path for faults. In this case, a photodetector 500 is stacked behind in-coupler 208. Light from light engine 116 is directed to in-coupler 208 along a support frame optical path. If the support frame optical path is free of faults up to in-coupler 208, in-coupler 208 will couple the light into lightguide 204, and photodetector 500 will detect the light that is coupled into lightguide 208. The output of photodetector 500 may be received by laser safety circuit 172 (or a variant thereof) and compared to a threshold to determine whether the support frame optical path has faults or not as previously described for the other OPFD systems. The system shown in FIG. 18 will not detect faults in optical paths within lightguide 204. However, the system shown in FIG. 18 can be combined with other systems that detect faults in lightguide optical paths but do not detect faults in support frame optical path, such as the system shown in FIG. 14.

Figure 19:
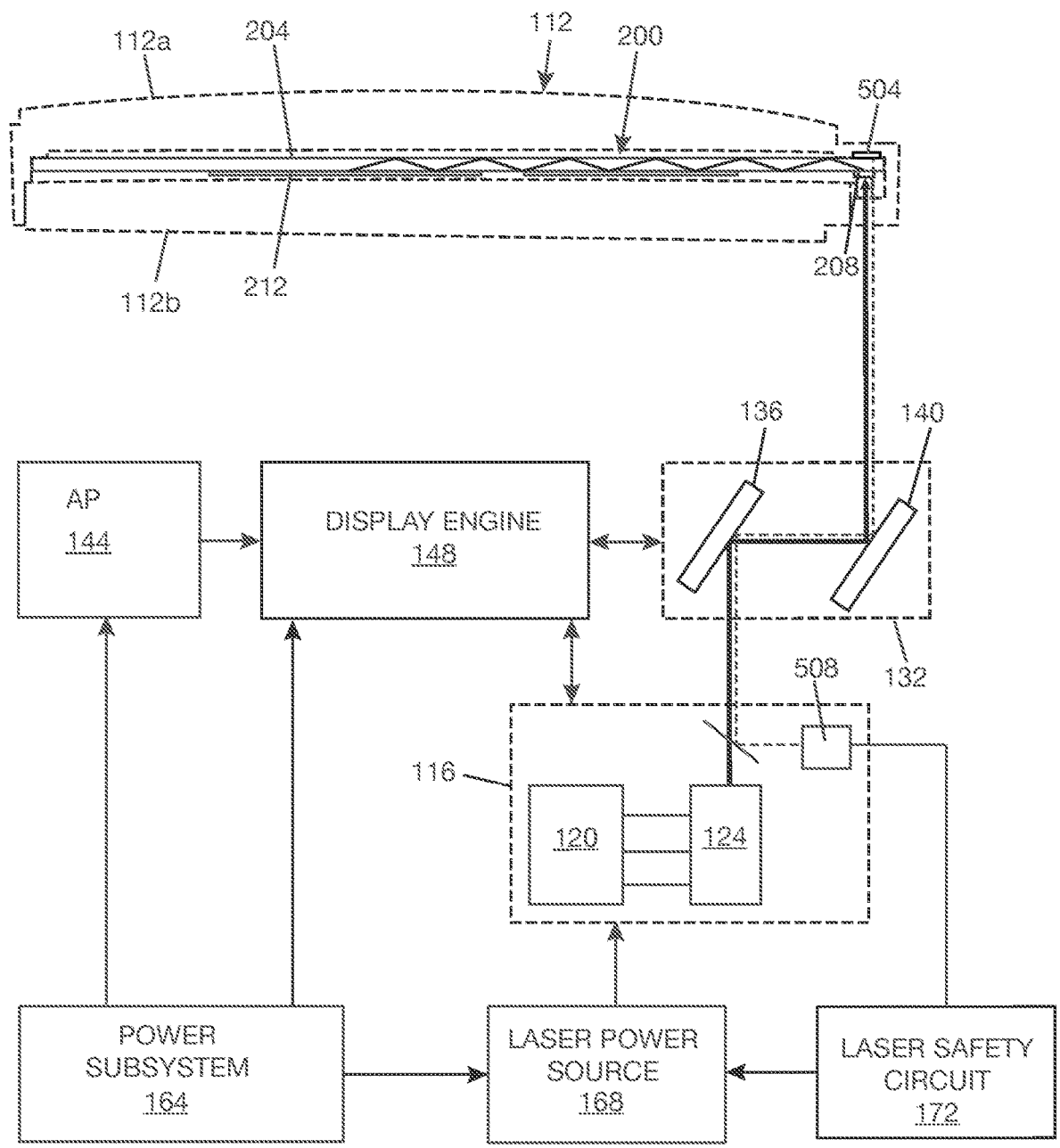
FIG. 19 is a schematic portion of a WHUD with a mirror behind an in-coupler for optical fault detection in a support frame optical path.

FIG. 19 shows another system that may be used to test a support frame optical path for faults. In this case, a mirror 504 is stacked behind in-coupler 208. Light from light engine 116 is directed to in-coupler 208 along a support frame optical path. If the support frame optical path is free of faults up to in-coupler 208, in-coupler 208 will couple the light into lightguide 204. At the same time, mirror 504 will reflect a portion of the light coupled into lightguide 204 back along the support frame optical path. A photodetector may be positioned to detect if there is returned light in the support frame optical path. As an example, a photodetector 508 may be provided in light engine 116 to detect the returned light. The output of photodetector 508 may be received by laser safety circuit 172 (or a variant thereof), which may process the output to determine whether or not to trigger an OPF event.

In the examples of FIGS. 18 and 19, OPF testing may be combined with transferring display images to the eye. That is, for example, an aggregated beam of display light and test light may be generated by light engine 116 and directed to in-coupler 208. Test light may be, for example, infrared light to which in-coupler 208 does not respond, which means that the test light will simply pass through in-coupler 208 to be detected by photodetector 500 (in FIG. 18) or returned by mirror 504 (in FIG. 19). In FIG. 19, mirror 504 essentially functions as a light source near display combiner 200 that directs light into the support frame optical path. Thus, in an alternative implementation of the system of FIG. 19, mirror 504 may be replaced with a light source. The light source may be stacked with in-coupler 208 or may be offset from in-coupler 208 but still in a position to direct light into the support frame optical path for detection within the temple.

Figure 20:
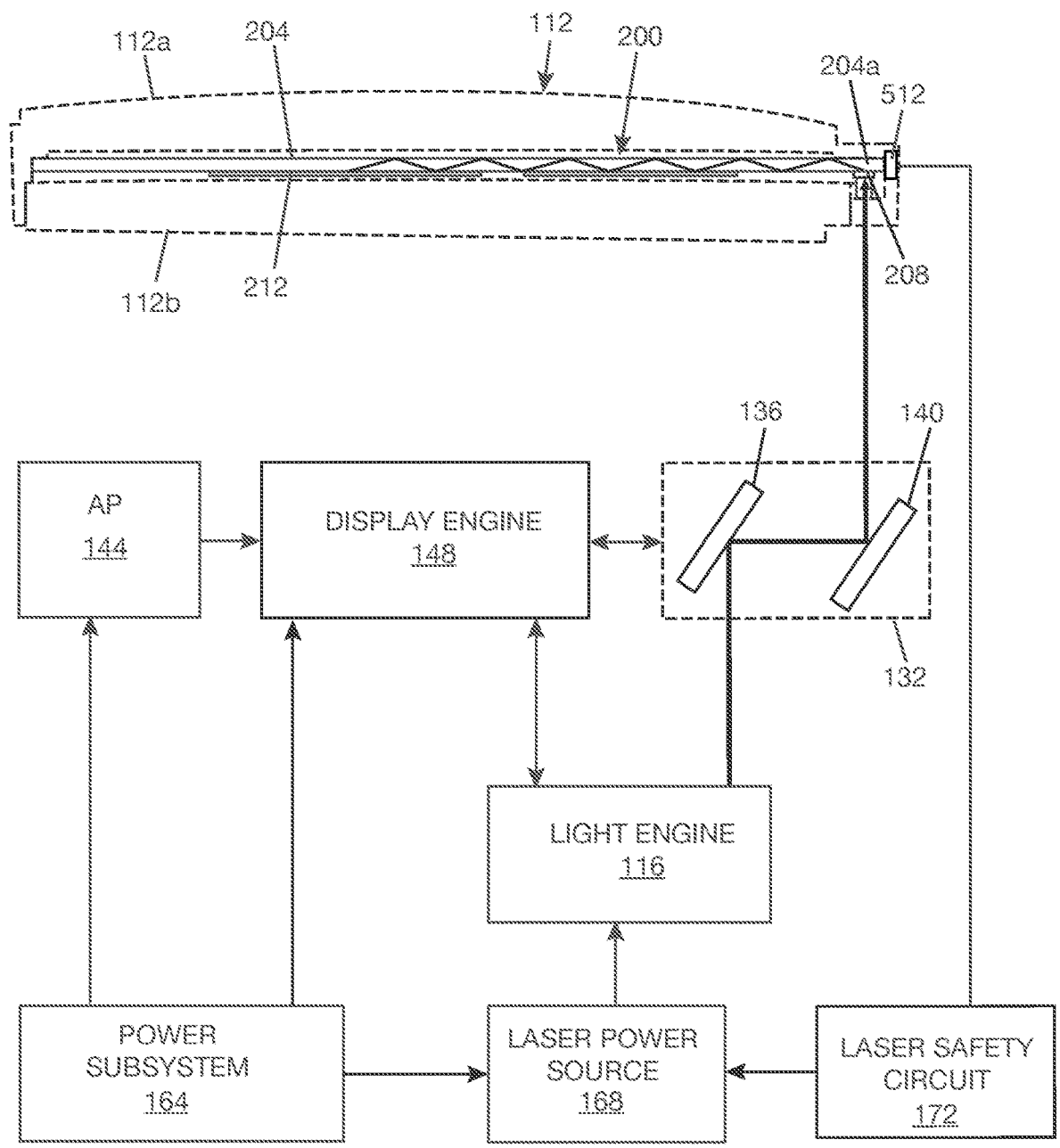
FIG. 20 is a schematic portion of a WHUD with a photodetector positioned to detect light emitted proximate an input region of a lightguide for optical fault detection in a support frame optical path.

When light is coupled into lightguide 204 by in-coupler 208, not all of the light will be directed into the primary optical path within the lightguide. Some of the light will be back-reflected to a portion of the perimeter surface of the lightguide near the input region of the lightguide. It is possible to detect this back reflection with a photodetector in order to verify that the support frame optical path is defined. For illustration purposes, FIG. 20 shows such a system, where a photodetector 512 is positioned to detect light reflected towards a portion of the perimeter surface of the lightguide proximate the input region of the lightguide. The output of photodetector 512 can be received by laser safety circuit 172 (or a variant thereof), which may process the output to determine whether or not to trigger an OPF event.

The above description of illustrated embodiments, including what is described in the Abstract of the disclosure, is not intended to be exhaustive or to limit the embodiments to the precise forms disclosed. Although specific embodiments and examples are described herein for illustrative purposes, various equivalent modifications can be made without departing from the spirit and scope of the disclosure, as will be recognized by those skilled in the relevant art. The teachings provided herein of the various embodiments can be applied to other portable and/or wearable electronic devices, not necessarily the exemplary wearable electronic devices generally described above.

The invention claimed is:

1. A wearable heads-up display, comprising:
at least one photodetector positioned proximate a perimeter of a lightguide to detect a first intensity of a portion of a test light emitted within the wearable heads-up display; and
a laser safety circuit coupled to the at least one photodetector, the laser safety circuit to reduce or shut off a supply of electrical power from a power source to a plurality of laser sources carried within the wearable heads-up display in response to the at least one photodetector indicating that the detected first intensity is below a first threshold.

2. The wearable heads-up display of claim 1, wherein the plurality of laser sources are visible laser sources, and wherein at least one of the visible laser sources generates the test light.

3. The wearable heads-up display of claim 1, wherein the plurality of laser sources includes a plurality of visible laser sources and at least one infrared laser source, and wherein the at least one infrared laser source generates the test light.

4. The wearable heads-up display of claim 1, further comprising a display engine to provide controls that modulate outputs of the plurality of laser sources according to display data, wherein the laser safety circuit is to provide a notification to the display engine in response to the at least one photodetector indicating that the detected first intensity is below the first threshold.

5. The wearable heads-up display of claim 1, further comprising:
the lightguide, wherein the lightguide has at least one optical path defined therein; and
an in-coupler positioned at an input region of the lightguide to couple light into the input region.

6. The wearable heads-up display of claim 5, further comprising at least one scan mirror positioned to receive an aggregated beam formed from outputs of the plurality of laser sources and redirect the aggregated beam to the in-coupler.

7. The wearable heads-up display of claim 5, further comprising an out-coupler positioned at an output region of the lightguide to direct light out of the output region.

8. The wearable heads-up display of claim 7, wherein the lightguide has a second optical path defined therein, and wherein the second optical path is in optical communication with the input region.

9. The wearable heads-up display of claim 8, further comprising an exit pupil expander positioned at a fold region of the lightguide that is intermediate between the input region and the output region, the exit pupil expander to redirect at least a portion of light propagating along the second optical path to the at least one optical path.

10. The wearable heads-up display of claim 9, further comprising a second photodetector positioned proximate to the perimeter of the lightguide to detect a second intensity of a portion of the test light that is emitted from the second optical path.

11. The wearable heads-up display of claim 10, wherein the laser safety circuit is to reduce or shut off the supply of electrical power from the power source to the plurality of laser sources in response to the second photodetector indicating that the detected second intensity is below a second threshold.

12. The wearable heads-up display of claim 11, further comprising a display engine to provide controls that modulate outputs of the plurality of laser sources according to display data, wherein the laser safety circuit is to provide a notification to the display engine in response to the at least one photodetector indicating that the detected first intensity is below the first threshold, the second photodetector indicating that the detected second intensity is below the second threshold, or both.

13. A wearable heads-up display, comprising:
a laser module including at least one laser source;
a lightguide having at least one optical path defined therein;
at least one light source to output a test light into the lightguide;
a photodetector positioned proximate to a perimeter of the lightguide to detect an intensity of a portion of the test light emitted from within the lightguide; and
a laser safety circuit coupled to a power source and the photodetector, the laser safety circuit to reduce or shut off a supply of electrical power from the power source to the laser module in response to an output signal from the photodetector indicating that the detected intensity is below a threshold.

14. The wearable heads-up display of claim 13, wherein the at least one light source is a laser diode or a light emitting diode.

15. The wearable heads-up display of claim 13, further comprising a support frame having a frame front and at least one temple coupled to the frame front, wherein the frame front carries at least one lens, and wherein the lightguide and in-coupler are integrated with the lens.

16. The wearable heads-up display of claim 15, wherein the at least one light source and photodetector are embedded in a portion of the frame front circumscribing the at least one lens.

17. A method comprising:
    testing a wearable heads-up display for optical path faults, the testing comprising:
        generating a test light; and
        detecting an intensity of a portion of the test light that is emitted at a perimeter of a lightguide; and
    in response to detecting that the intensity is below a threshold, reducing or shutting off a supply of electrical power from a power source to a plurality of laser sources.

18. The method of claim 17, further comprising projecting one or more display images to a display space within a field of view of the wearable heads-up display, wherein projecting each display image comprises:
    forming a display light from a combination of laser light generated by the plurality of laser sources; and
    coupling the display light into the lightguide.

19. The method of claim 18, wherein projecting the one or more display images to the display space within the field of view is interspersed with testing the wearable heads-up display for optical path faults.

20. The method of claim 18, wherein reducing the supply of electrical power from the power source to the plurality of laser sources comprises limiting the supply of electrical power to the plurality of laser sources such that an optical power density of the display light does not exceed the maximum permissible exposure for a Class 1 laser.

\* \* \* \* \*